(12) United States Patent
Kim et al.

(10) Patent No.: US 9,443,932 B2
(45) Date of Patent: Sep. 13, 2016

(54) SEMICONDUCTOR DEVICE AND METHOD OF FABRICATING THE SAME

(71) Applicant: Samsung Electronics Co., Ltd., Suwon-si (KR)

(72) Inventors: Ki-Chul Kim, Seongnam-si (KR); Joonghan Shin, Yongin-si (KR); Bongjin Kuh, Suwon-si (KR); Taegon Kim, Seoul (KR); Hanmei Choi, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 27 days.

(21) Appl. No.: 14/330,777

(22) Filed: Jul. 14, 2014

(65) Prior Publication Data

US 2015/0115368 A1 Apr. 30, 2015

(30) Foreign Application Priority Data

Oct. 30, 2013 (KR) ........................ 10-2013-0130411

(51) Int. Cl.
| | |
|---|---|
| *H01L 21/70* | (2006.01) |
| *H01L 29/06* | (2006.01) |
| *H01L 27/092* | (2006.01) |
| *H01L 21/8238* | (2006.01) |

(52) U.S. Cl.
CPC ... *H01L 29/0696* (2013.01); *H01L 21/823807* (2013.01); *H01L 27/092* (2013.01)

(58) Field of Classification Search
None
See application file for complete search history.

(56) References Cited

U.S. PATENT DOCUMENTS

| | | | |
|---|---|---|---|
| 6,624,459 B1 * | 9/2003 | Dachtera | G11C 11/412 257/296 |
| 7,378,309 B2 | 5/2008 | Lee et al. | |
| 7,547,914 B2 | 6/2009 | Kermarec et al. | |
| 7,759,175 B2 | 7/2010 | Clavelier et al. | |
| 8,304,272 B2 | 11/2012 | Assefa et al. | |
| 2006/0145264 A1 * | 7/2006 | Chidambarrao | H01L 21/82380 257/369 |
| 2007/0166960 A1 | 7/2007 | Ponomarev | |
| 2007/0218622 A1 | 9/2007 | Lee et al. | |
| 2007/0278494 A1 | 12/2007 | Kermarec et al. | |
| 2008/0220594 A1 | 9/2008 | Clavelier et al. | |
| 2012/0001283 A1 | 1/2012 | Assefa et al. | |

FOREIGN PATENT DOCUMENTS

| | | |
|---|---|---|
| JP | 2007-515790 A | 6/2007 |
| KR | 10-2007-0071995 A | 7/2007 |
| KR | 10-0738459 B1 | 7/2007 |
| KR | 10-2010-0025836 A | 3/2010 |
| KR | 10-2010-0096480 A | 9/2010 |
| KR | 10-0991213 B1 | 11/2010 |
| KR | 10-1050142 B1 | 7/2011 |

OTHER PUBLICATIONS

"Dual-channel CMOS for (sub)-22 nm high performance logic"; DualLogic; STMicroelectronics, LETI; Jan. 30, 2011; pp. 1-16.

* cited by examiner

*Primary Examiner* — Sonya D McCall Shepard
(74) *Attorney, Agent, or Firm* — Sughrue Mion, PLLC

(57) ABSTRACT

Provided are a semiconductor device and a method of fabricating the same. The semiconductor device may include a plurality of unit cells provided on a semiconductor substrate. Each of the unit cells may include a buried insulating pattern buried in the semiconductor substrate, a first active pattern provided on the buried insulating pattern, and a second active pattern provided on the buried insulating pattern and spaced apart from the first active pattern. The buried insulating pattern may define a unit cell region, in which each of the unit cells may be disposed.

12 Claims, 19 Drawing Sheets

SEMICONDUCTOR DEVICE AND METHOD OF FABRICATING THE SAME

CROSS-REFERENCE TO RELATED APPLICATIONS

This application claims priority from Korean Patent Application No. 10-2013-0130411, filed on Oct. 30, 2013, in the Korean Intellectual Property Office, the entire disclosure of which is incorporated herein by reference.

BACKGROUND

Apparatuses and methods consistent with exemplary embodiments relate to a semiconductor device and a method of fabricating the same, and in particular, to a semiconductor device including a field effect transistor and a method of fabricating the same.

A semiconductor device may be provided in the form of an integrated circuit (IC) chip including metal-oxide-semiconductor field-effect transistors (MOS-FETs). As reduction in size and design rule of the semiconductor devices is accelerated, the MOS-FETs are being scaled down increasingly. As the result of the reduction in size of the MOS-FET, a short channel effect may occur, which could lead to deterioration in operation of the semiconductor device. A variety of methods are being studied to overcome such limitations associated with the scale-down of the semiconductor device and improve characteristics of the semiconductor device.

SUMMARY

One or more exemplary embodiments provide a semiconductor device having improved electric characteristics and a method of fabricating the same.

One or more exemplary embodiments also provide a cost-effective semiconductor device and a method of fabricating the same.

According to an aspect of an exemplary embodiment, there is provided a semiconductor device including a plurality of unit cells provided on a semiconductor substrate. Each of the unit cells may include a buried insulating pattern buried in the semiconductor substrate, a first active pattern provided on the buried insulating pattern, and a second active pattern provided on the buried insulating pattern and spaced apart from the first active pattern. The buried insulating pattern may define a unit cell region, in which each of the unit cells may be disposed.

The semiconductor substrate may include a portion extending along a sidewall of the buried insulating pattern and defining the unit cell region.

The semiconductor substrate may be a bulk silicon wafer.

The first active pattern may include a semiconductor material which is different from that of the second active pattern.

The buried insulating pattern may include a first region and a second region. The first active pattern may be disposed on the first region, and the second active pattern may be disposed on the second region. Here, one of the first and second regions may be an N-type metal-oxide-semiconductor (NMOS) region and the other may be a P-type metal-oxide-semiconductor (PMOS) region.

The device may further include an isolation pattern disposed on the buried insulating pattern and between the first and second active patterns.

The device may further include a first gate electrode disposed on the buried insulating pattern to cross the first active pattern and a second gate electrode disposed on the buried insulating pattern to cross the second active pattern.

According to an aspect of another exemplary embodiment, there is provided a method of fabricating a semiconductor device, the method including forming a buried insulating pattern in a semiconductor substrate, forming a recess region in the buried insulating pattern exposing an inner side surface of the semiconductor substrate by etching an upper portion of the buried insulating pattern, forming a first semiconductor pattern in the recess region, and forming a second semiconductor pattern in the recess region. The first and second semiconductor patterns may include semiconductor materials different from each other.

The semiconductor substrate may be a bulk silicon wafer.

The forming the buried insulating pattern may include forming a stop layer on the semiconductor substrate and patterning the stop layer and the semiconductor substrate to form a trench delimiting a unit cell region. The buried insulating pattern may be formed to fill the trench.

The first semiconductor pattern may be formed to have a top surface that is substantially coplanar with that of the second semiconductor pattern.

The method may further include forming a stop layer on the semiconductor substrate, before the forming the buried insulating pattern.

The forming the first semiconductor pattern may include forming a first semiconductor layer on the semiconductor substrate to fill the recess region, patterning the first semiconductor layer to form a first opening exposing a portion of a top surface of the buried insulating pattern and a portion of the semiconductor substrate, forming a first capping layer to fill the first opening and cover the first semiconductor layer, performing a first annealing process to the semiconductor substrate provided with the first capping layer at a temperature higher than a melting point of the first semiconductor layer to recrystallize the first semiconductor layer, and planarizing the first capping layer and the first semiconductor layer to expose the stop layer and form a first capping pattern and the first semiconductor pattern.

The first annealing process may be performed using an inner side surface of the semiconductor substrate exposed by the recess region as a seed layer to form the first semiconductor layer having a single crystalline structure.

The forming the second semiconductor pattern may include patterning the first capping pattern to form a second opening exposing a portion of a top surface of the buried insulating pattern and a portion of the semiconductor substrate, forming a second semiconductor layer to fill the second opening, forming a second capping layer to cover the first semiconductor pattern and the second semiconductor layer, performing a second annealing process to the semiconductor substrate provided with the second capping layer at a temperature higher than a melting point of the second semiconductor layer to recrystallize the second semiconductor layer, and planarizing the second capping layer and the second semiconductor layer to expose the stop layer. The second annealing process may be performed at a temperature lower than that for the first annealing process.

The method may further include patterning the first semiconductor pattern to form a first active pattern, patterning the second semiconductor pattern to form a second active pattern, forming a first gate electrode to cross the first active pattern, and forming a second gate electrode to cross the second active pattern. The first active pattern and the second active pattern may be formed at substantially the same time.

According to an aspect of another exemplary embodiment, there is provided a semiconductor device including a semiconductor substrate which comprises a plurality of unit cells, a buried insulating pattern buried in the semiconductor substrate, which comprises a first region on which a first active pattern is provided and a second region on which a second active pattern is provided, a first transistor formed on the buried insulating pattern, which comprises a first gate electrode crossing the first active pattern, a first channel region positioned below the first gate electrode, and first source/drain regions positioned at both sides of the first gate electrode, and a second transistor formed on the buried insulating pattern, which comprises a second gate electrode crossing the second active pattern, a second channel region positioned below the second gate electrode, and second source/drain regions positioned at both sides of the second gate electrode.

BRIEF DESCRIPTION OF THE DRAWINGS

The above and/or other aspects will be more clearly understood from the following description of exemplary embodiments taken in conjunction with the accompanying drawings in which:

FIGS. 4A through 13A are plan views illustrating a method of fabricating a semiconductor device, according to an exemplary embodiment;

FIGS. 4B through 13B are sectional views taken along lines I-I' of FIGS. 4A through 13A, respectively;

FIGS. 15A through 18A are plan views illustrating a method of fabricating a semiconductor device, according to another exemplary embodiment;

FIGS. 15B through 18B are sectional views taken along lines I-I' of FIGS. 15A through 18A, respectively.

DETAILED DESCRIPTION OF THE EXEMPLARY EMBODIMENTS

Figure 1:
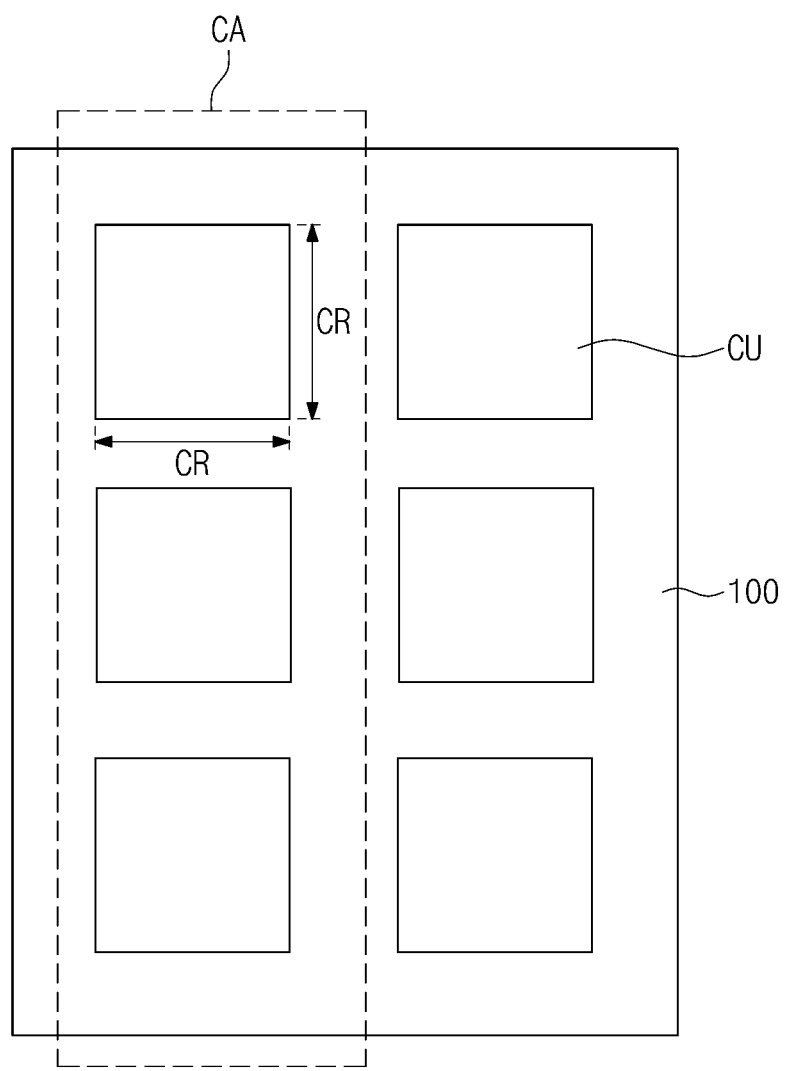
FIG. 1 is a plan view illustrating a cell array of a semiconductor device according to an exemplary embodiment.

Example embodiments will now be described more fully with reference to the accompanying drawings, in which various exemplary embodiments are shown. The exemplary embodiments may, however, be embodied in many different forms and should not be construed as being limited to the exemplary embodiments set forth herein; rather, the described exemplary embodiments are provided so that this disclosure will be thorough and complete, and will fully convey the scope of the exemplary embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a similar fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of exemplary embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. In other words, the device may be otherwise reoriented (e.g., rotated 90 degrees or at other orientations) and the spatially relative descriptors used herein interpreted accordingly.

The terminology used herein is for the purpose of describing particular exemplary embodiments only and is not intended to be limiting of the exemplary embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Exemplary embodiments are described herein with reference to cross-sectional illustrations that are schematic illustrations of idealized embodiments (and intermediate structures) of the exemplary embodiments. As such, variations from the shapes of the illustrations as a result, for example, of manufacturing techniques and/or tolerances, are to be expected. Thus, the exemplary embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the exemplary embodiments.

Unless otherwise defined, all terms (including technical and scientific terms) used herein have the same meaning as commonly understood by one of ordinary skill in the art to which exemplary embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
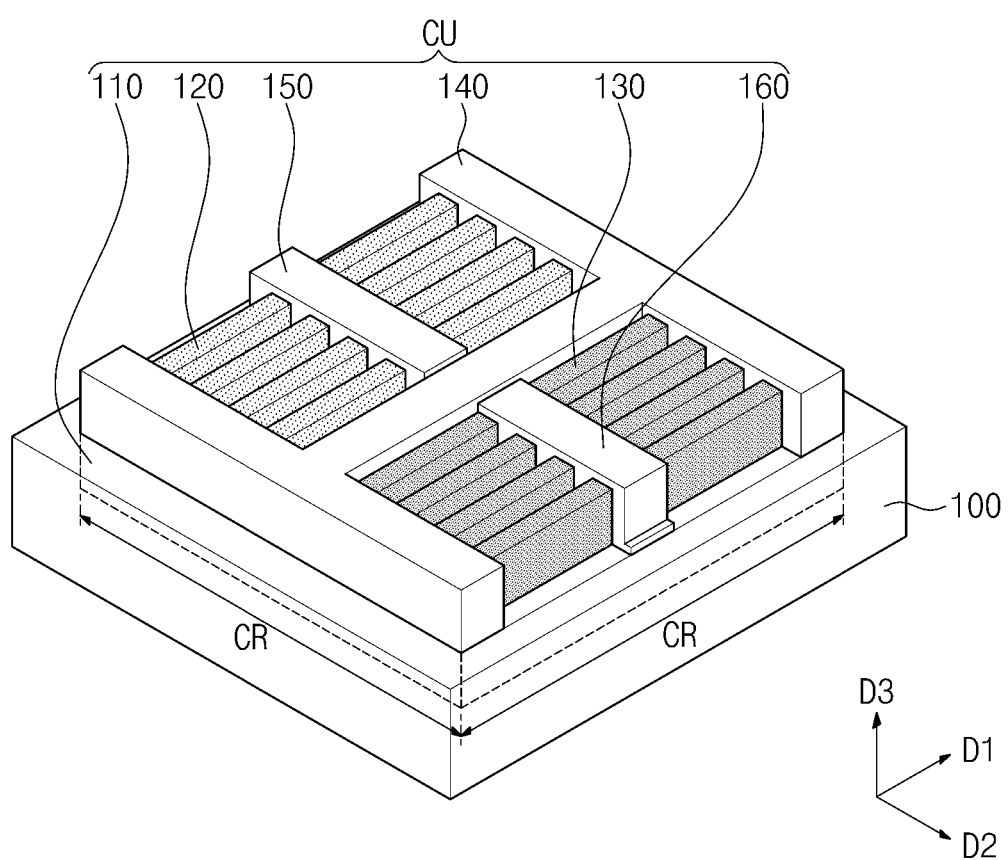
FIG. 2 is a perspective view of a semiconductor device according to an exemplary embodiment.
Figure 3A:
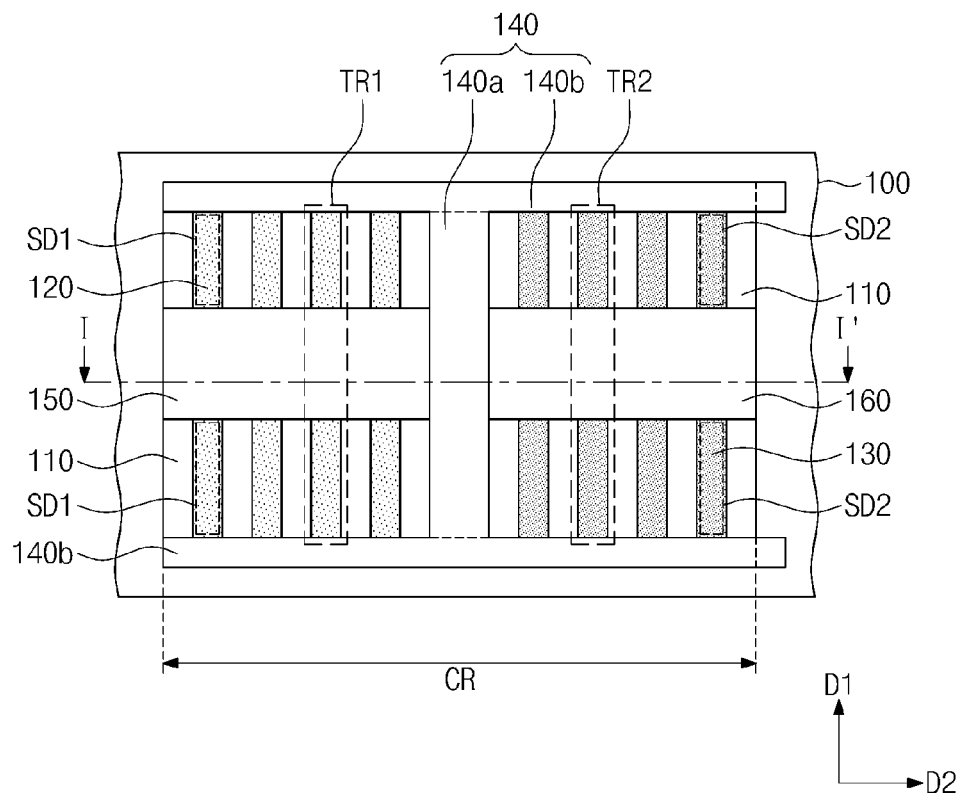
FIG. 3A is a plan view of a semiconductor device according to an exemplary embodiment.
Figure 3B:
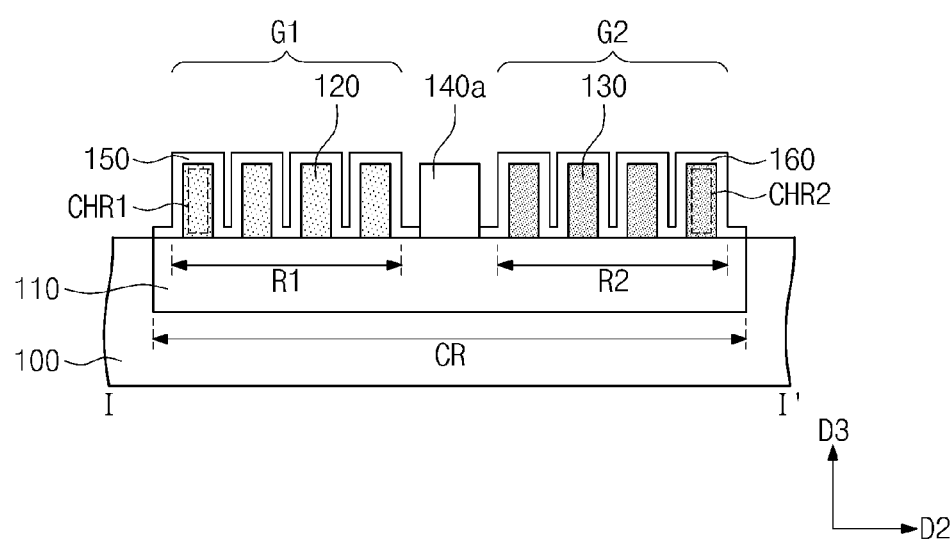
FIG. 3B is a sectional view taken along line I-I' of FIG. 3A.

FIG. 1 is a plan view illustrating a cell array of a semiconductor device according to an exemplary embodiment, and FIG. 2 is a perspective view of a semiconductor device according to an exemplary embodiment. FIG. 3A is a plan view of a semiconductor device according to an exemplary embodiment, and FIG. 3B is a sectional view taken along line I-I' of FIG. 3A.

Referring to FIGS. 1, 2, 3A, and 3B, a semiconductor substrate 100 may include a cell array CA, on which a plurality of unit cells CU are provided. The plurality of unit cells CU may be provided on a plurality of unit cell regions CR, respectively.

Each of the unit cells CU may include a buried insulating pattern 110 buried in the semiconductor substrate 100, a first active pattern 120 provided on the buried insulating pattern 110, a second active pattern 130 provided on the buried insulating pattern 110 and spaced apart from the first active pattern 120, a first gate electrode 150 crossing the first active pattern 120, and a second gate electrode 160 crossing the second active pattern 130. In exemplary embodiments, each of the unit cells CU may further include an isolation pattern 140 provided between the first active pattern 120 and the second active pattern 130.

The semiconductor substrate 100 may be a bulk silicon wafer. For example, the semiconductor substrate 100 may be a bulk silicon wafer having a crystalline structure.

The buried insulating pattern 110 may include, for example, silicon oxide. The semiconductor substrate 100 may extend along sidewalls of the buried insulating pattern 110 and thereby delimiting the unit cell region CR. For example, the buried insulating pattern 110 may be provided in the semiconductor substrate 100, thereby defining the unit cell region CR.

The buried insulating pattern 110 may include a first region R1 and a second region R2, which are distinct from each other and are configured to realize different threshold voltages from each other. For example, one of the first and second regions R1 and R2 may be an NMOS region, and the other may be a PMOS region.

The first active pattern 120 may be disposed on the first region R1 of the buried insulating pattern 110. The first active pattern 120 may have a line-shaped structure extending in a first direction D1. In exemplary embodiments, a plurality of first active patterns 120 may be formed in the unit cell CU. In this case, each of the first active patterns 120 may extend in the first direction D1 and be spaced apart from each other in a second direction D2 that is perpendicular to the first direction D1.

The first active pattern 120 may include a semiconductor material. As an example, the first active pattern 120 may include at least one of silicon (Si), germanium (Ge), silicon-germanium (SiGe), or III-V compound. The first active pattern 120 may include a single crystalline semiconductor material.

The second active pattern 130 may be disposed on the second region R2 of the buried insulating pattern 110. The second active pattern 130 may have a line-shaped structure extending in the first direction D1 and be spaced apart from the first active pattern 120 in the second direction D2. In exemplary embodiments, a plurality of second active patterns 130 may be formed in the unit cell CU. In this case, each of the second active patterns 130 may extend in the first direction D1 and be spaced apart from each other in the second direction D2. Referring to FIG. 3B, in the case where the plurality of the first active patterns 120 and the plurality of the second active patterns 130 are provided on the unit cell CU, a first group G1 of the first active patterns 120 may be spaced apart from a second group G2 of the second active patterns 130 in the second direction D2 by the isolation pattern 140 disposed between the first group G1 and the second group G2.

The second active pattern 130 may include a semiconductor material. As an example, the second active pattern 130 may include at least one of silicon (Si), germanium (Ge), silicon-germanium (SiGe), or III-V compound. The second active pattern 130 may include a single crystalline semiconductor material. The first active pattern 120 and the second active pattern 130 may be formed of or include different semiconductor materials from each other. For example, in the case where the first active pattern 120 is formed of or include silicon (Si), the second active pattern 130 may include germanium (Ge) or silicon-germanium (SiGe).

The isolation pattern 140 may be disposed on the buried insulating pattern 110. The isolation pattern 140 may include a line-shaped first pattern 140a extending in the first direction D1 and line-shaped second patterns 140b extending in the second direction D2. The first pattern 140a may be disposed between the first active pattern 120 and the second active pattern 130 and be spaced apart from the first and second active patterns 120 and 130. The second patterns 140b may be spaced apart from each other in the first direction D1 and be connected to ends of the first and second active patterns 120 and 130. In addition, the second patterns 140b may be in contact with both ends of the first pattern 140a, respectively, and the first pattern 140a and the second patterns 140b may be connected to form a single body. The isolation pattern 140 may include, for example, silicon oxide.

The first gate electrode 150 and the second gate electrode 160 may be disposed on the first active pattern 120 and the second active pattern 130, respectively.

The first active pattern 120 may include a first channel region CHR1 positioned below the first gate electrode 150 and first source/drain regions SD1 positioned at both sides of the first gate electrode 150. The first gate electrode 150 may be provided to cover a top surface and both sidewalls of the first channel region CHR1. In exemplary embodiments, a first transistor TR1 may include the first channel region CHR1, the first source/drain regions SD1, and the first gate electrode 150.

The second active pattern 130 may include a second channel region CHR2 positioned below the second gate electrode 160 and second source/drain regions SD2 positioned at both sides of the second gate electrode 160. The second gate electrode 160 may be provided to cover a top surface and both sidewalls of the second channel region CHR2. In exemplary embodiments, a second transistor TR2 may include the second channel region CHR2, the second source/drain regions SD2, and the second gate electrode 160.

In the case where each of the unit cells CU may include a plurality of the first active patterns 120, the first gate electrode 150 may be provided to cross the plurality of the first active patterns 120, and in this case, a plurality of the first transistors TR1 may be provided on the first region R1. Further, in the case where each of the unit cells CU may include a plurality of the second active patterns 130, the second gate electrode 160 may be provided to cross the plurality of the second active patterns 130, and in this case, a plurality of the second transistors TR2 may be provided on the second region R2.

The first and second gate electrodes 150 and 160 may be separated from each other with the first pattern 140a interposed therebetween. The first and second gate electrodes 150 and 160 may include at least one of conductive metal nitrides (e.g., titanium nitride or tantalum nitride) or metals (e.g., aluminum or tungsten).

According to exemplary embodiments, the buried insulating pattern 110 may be provided on a bulk silicon wafer to define the unit cell region CR, and the first and second active patterns 120 and 130 including semiconductor materials different from each other may be provided on the buried insulating pattern 110. The first and second gate electrodes 150 and 160 may be provided on the buried insulating pattern 110 to cross the first and second active patterns 120 and 130, respectively. Accordingly, the first and second transistors TR1 and TR2 on the buried insulating pattern 110 may be configured to have different electric characteristics from each other. Since the first and second transistors TR1 and TR2 having different electric characteristics from each other are provided in the unit cell CU of the bulk-silicon-based semiconductor device, it is possible to improve cost-effectively electric characteristics of the semiconductor device.

Although not shown, an interlayered insulating layer may be provided on the structure including the first and second gate electrodes 150 and 160. Contact plugs may be connected to the source/drain regions SD1 and SD2 through the interlayered insulating layer, and interconnection lines may be provided on the interlayered insulating layer and be connected to the contact plugs. Accordingly, the interconnection lines may be connected to the source/drain regions SD1 and SD2 through the contact plugs.

FIGS. 4A through 13A are plan views illustrating a method of fabricating a semiconductor device, according to exemplary embodiments, and FIGS. 4B through 13B are sectional views taken along lines I-I' of FIGS. 4A through 13A, respectively.

Figure 4A:
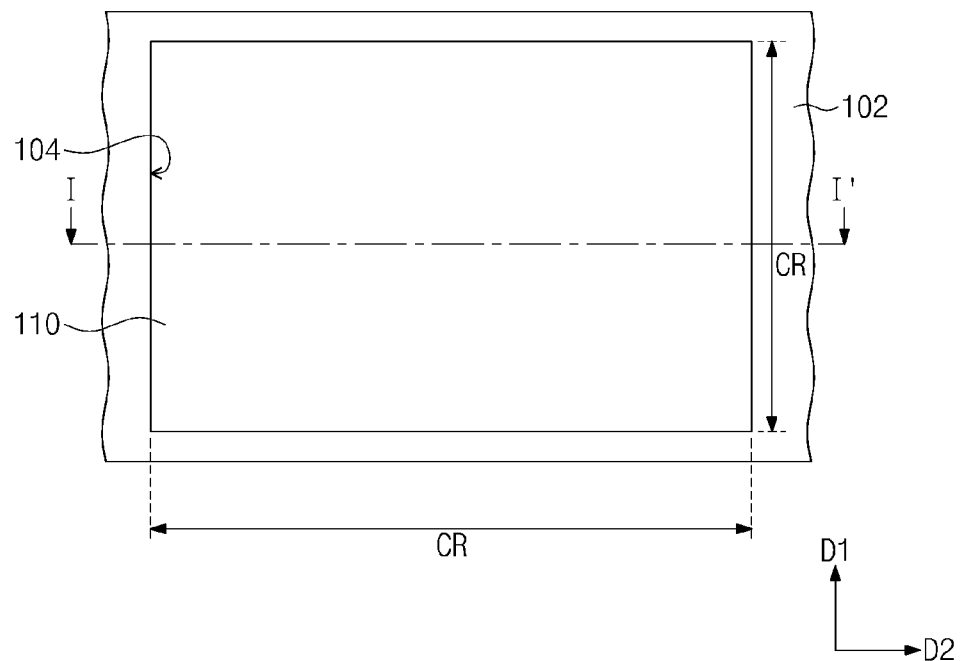
Figure 4B:
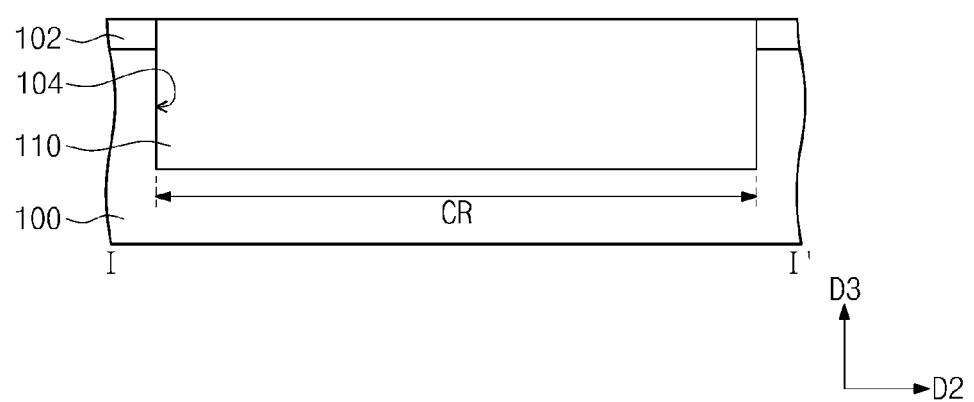

Referring to FIGS. 4A and 4B, a buried insulating pattern 110 may be formed on or in a semiconductor substrate 100. For example, the semiconductor substrate 100 may be a bulk silicon wafer having a crystalline structure. Forming the buried insulating pattern 110 may include forming a stop layer 102 on the semiconductor substrate 100, etching the semiconductor substrate 100 and the stop layer 102 to form a trench 104 defining a unit cell region CR, forming an insulating layer on the semiconductor substrate 100 to fill the trench 104, and planarizing the insulating layer to expose the stop layer 102. As the result of the planarization process, the buried insulating pattern 110 may be locally formed within the trench 104. As an example, the stop layer 102 may be formed of or include a silicon nitride layer, and the insulating layer may be formed of or include a silicon oxide layer.

Figure 5A:
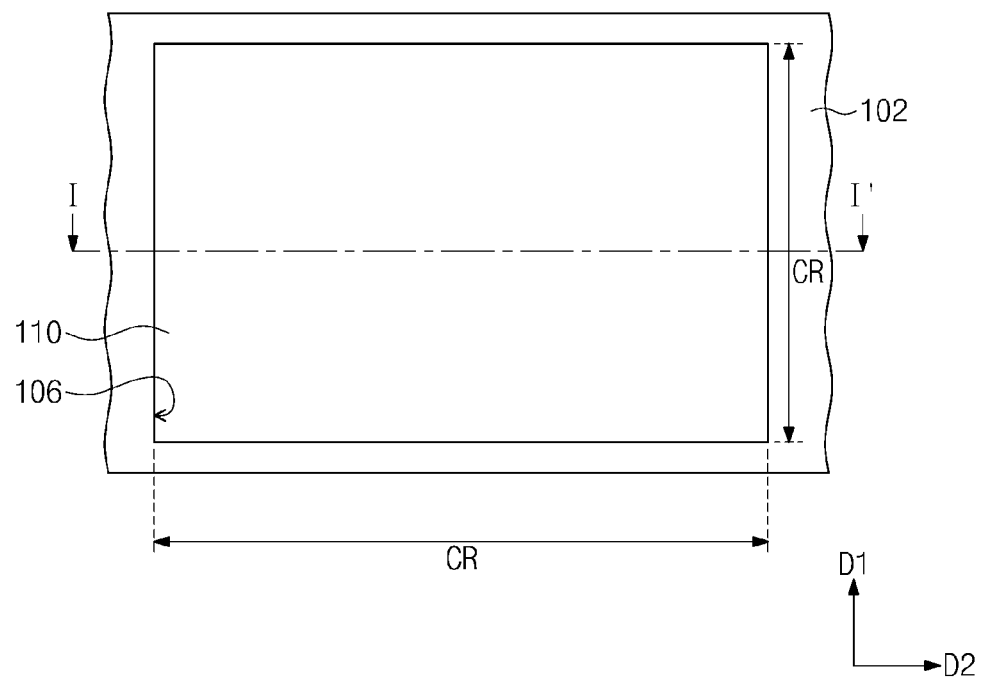
Figure 5B:
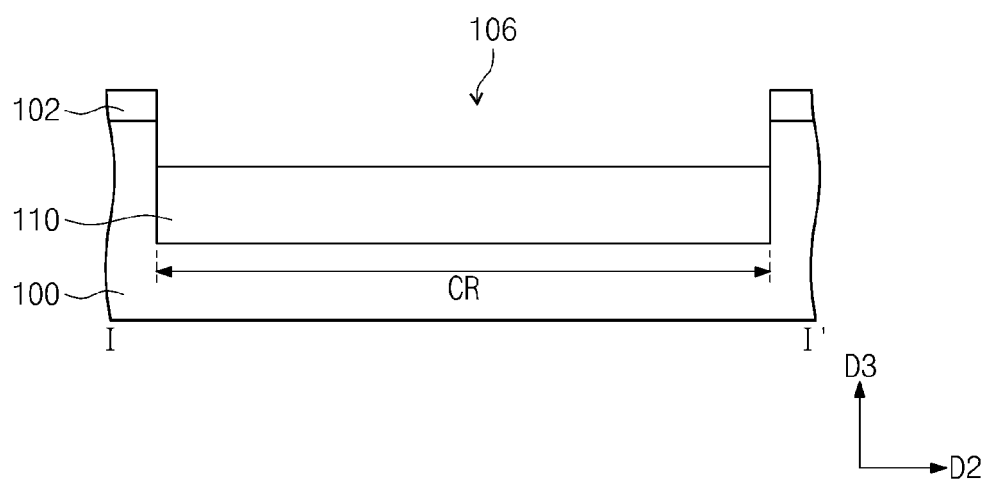

Referring to FIGS. 5A and 5B, an upper portion of the buried insulating pattern 110 may be etched to form a recess region 106 exposing inner sidewalls of the stop layer 102 and the semiconductor substrate 100. The recess region 106 may be formed by an etching technique capable of providing a high etch selectivity with respect to the stop layer 102 and the semiconductor substrate 100. As an example, the recess region 106 may be formed by a wet etching process using hydrofluoric acid (HF). The recess region 106 may be overlapped with the trench 104, when viewed in a plan view.

Figure 6A:
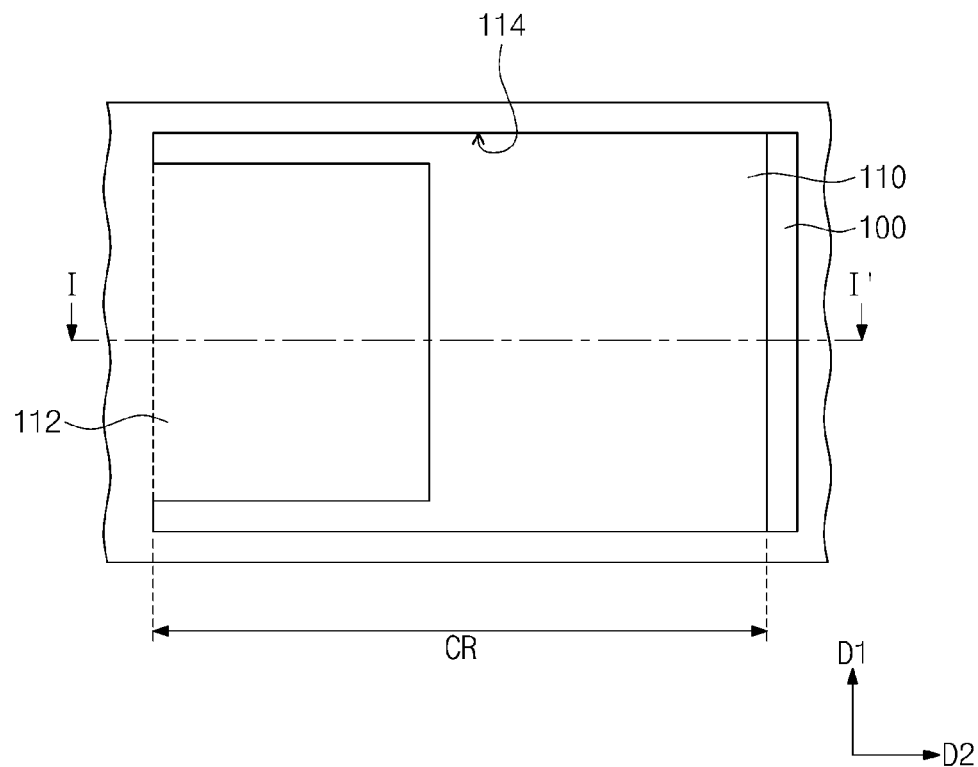
Figure 6B:
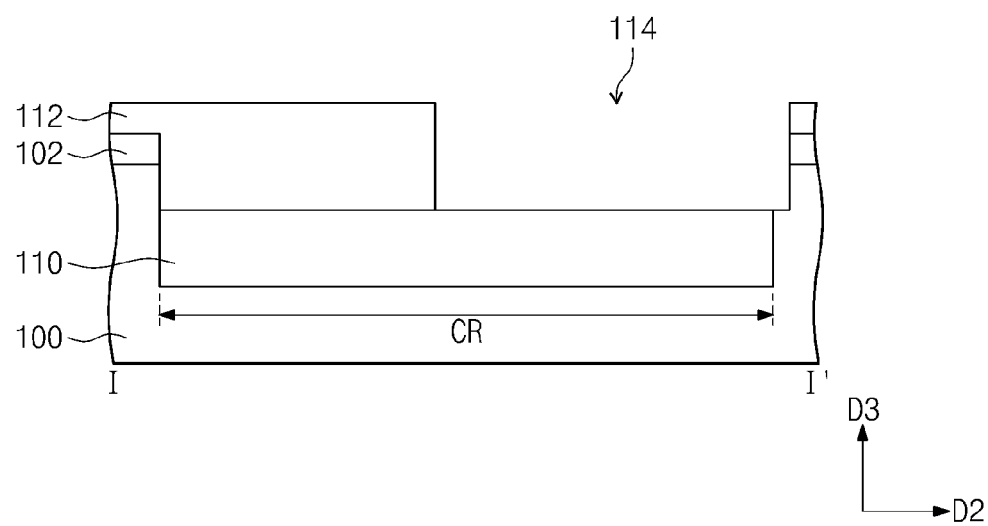

Referring to FIGS. 6A and 6B, a first semiconductor layer 112 may be formed on the semiconductor substrate 100 to fill the recess region 106. The first semiconductor layer 112 may include at least one of amorphous layers made of silicon (Si), germanium (Ge), silicon-germanium (SiGe), or III-V compounds. The first semiconductor layer 112 may be formed using a deposition process (e.g., a chemical vapor deposition (CVD) or a sputtering process). Thereafter, the first semiconductor layer 112 may be patterned to form a first opening 114 exposing a portion of a top surface of the buried insulating pattern 110 and a portion of the semiconductor substrate 100. The first opening 114 may be partially overlapped with the recess region 106, when viewed in a plan view.

In exemplary embodiments, the patterning of the first semiconductor layer 112 may be performed using an etching process capable of providing a high etch selectivity with respect to the buried insulating pattern 110. The stop layer 102 and the semiconductor substrate 100 may be partially removed during the etching process.

Figure 7A:
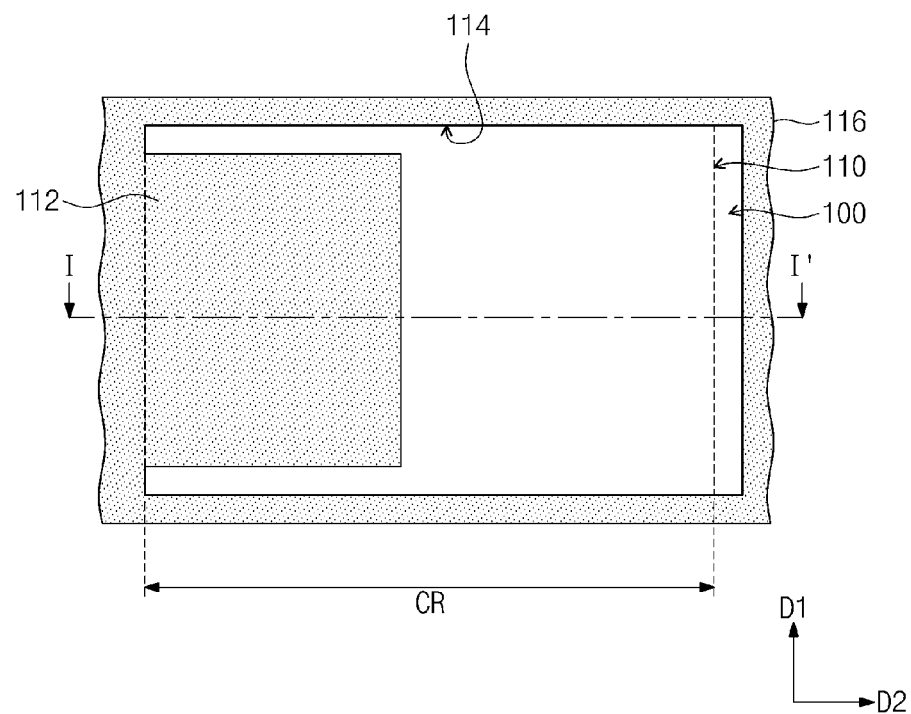
Figure 7B:
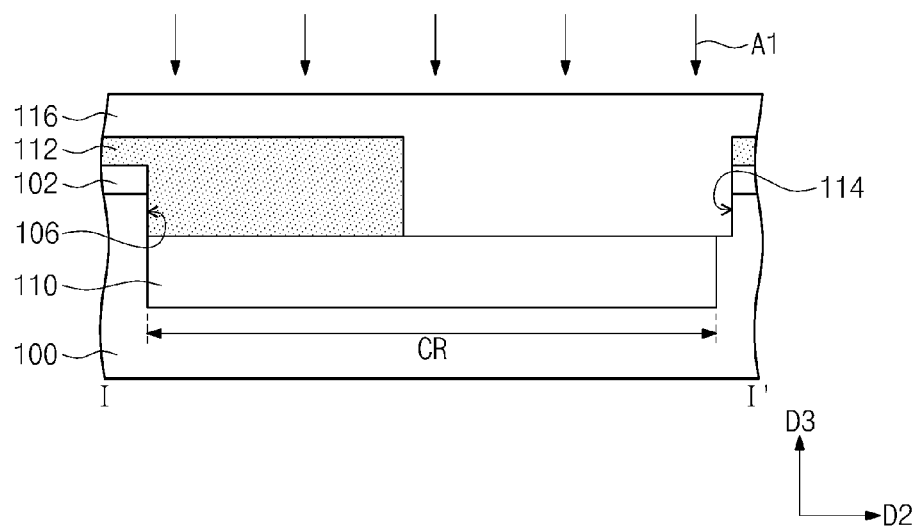

Referring to FIGS. 7A and 7B, a first capping layer 116 may be formed on the semiconductor substrate 100 to fill the first opening 114 and cover the first semiconductor layer 112. As an example, the first capping layer 116 may be a silicon oxide layer. The first capping layer 116 may be formed using a chemical vapor deposition (CVD) process and so forth. Thereafter, a first annealing process A1 may be performed to the semiconductor substrate 100 provided with the first capping layer 116. The first annealing process A1 may be performed at a temperature that is higher than a melting point of the first semiconductor layer 112. For example, the first annealing process A1 may be performed using a laser annealing process or a rapid thermal treatment process. In exemplary embodiments, the first annealing process A1 may be performed to recrystallize the first semiconductor layer 112. For example, in the first annealing process A1, an inner surface of the semiconductor substrate 100 exposed by the recess region 106 may be used as a seed layer for recrystallizing the first semiconductor layer 112, and consequently, the first semiconductor layer 112 may have a single crystalline structure.

Figure 8A:
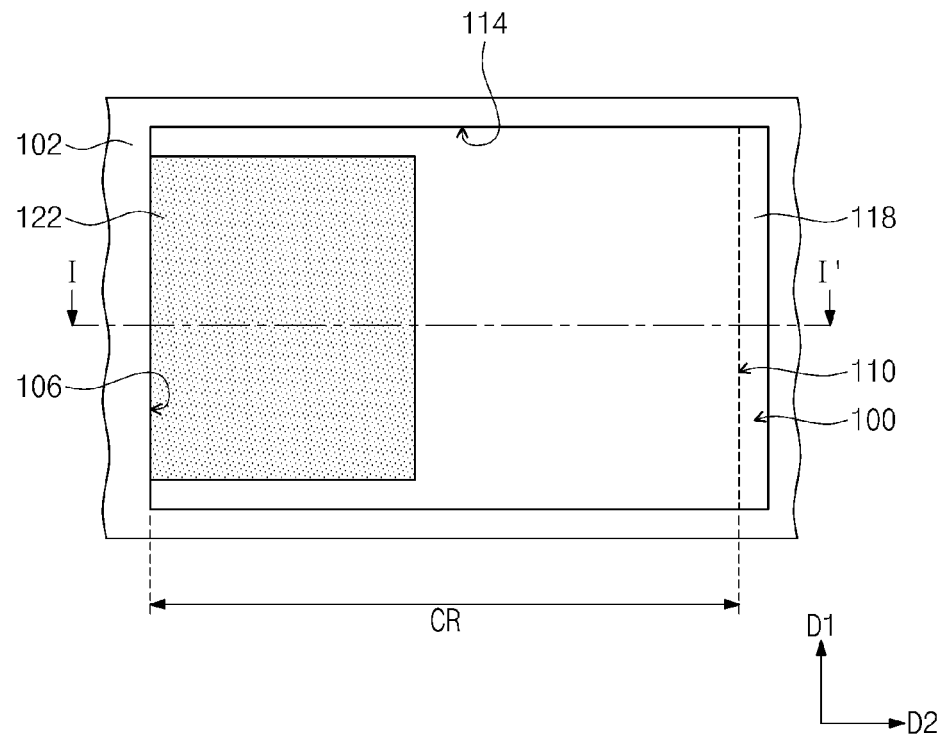
Figure 8B:
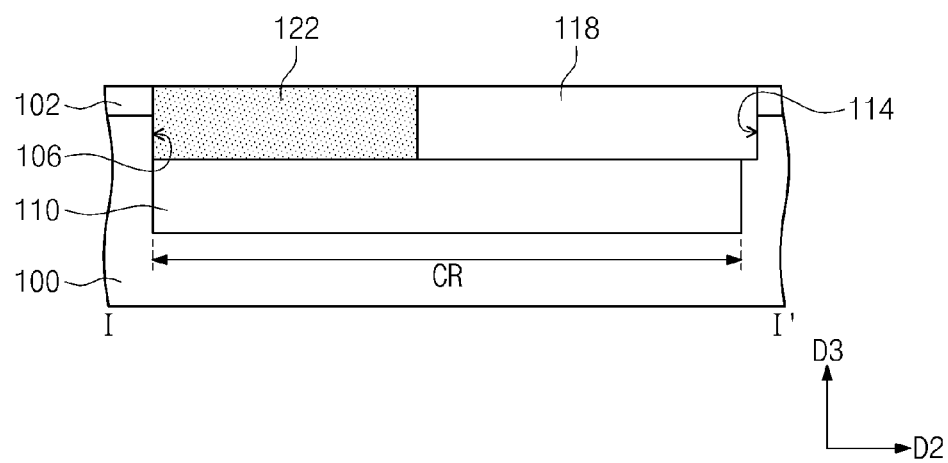

Referring to FIGS. 8A and 8B, a planarization process may be performed to the first capping layer 116 and the first semiconductor layer 112, thereby exposing the stop layer 102 and forming a first semiconductor pattern 122 and a first capping pattern 118. The first capping pattern 118 may be formed to fill the first opening 114. The first semiconductor pattern 122 may be formed to fill a portion of the recess region 106, where is not overlapped with the first opening 114. As the result of the first annealing process A1, at least a portion of the first semiconductor pattern 122 may have a single crystalline structure.

Figure 9A:
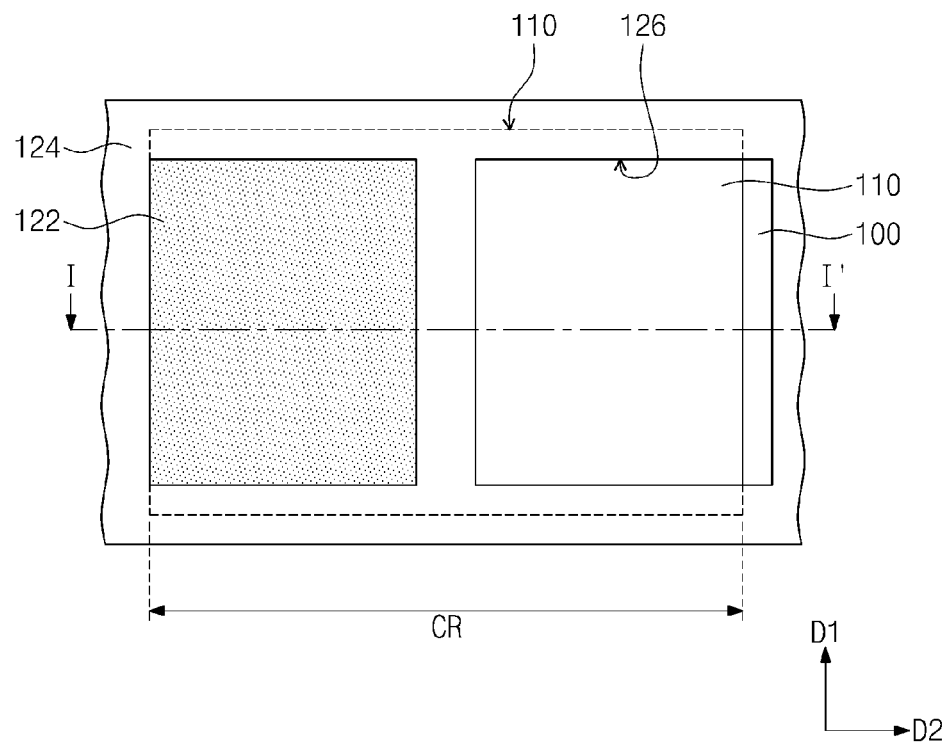
Figure 9B:
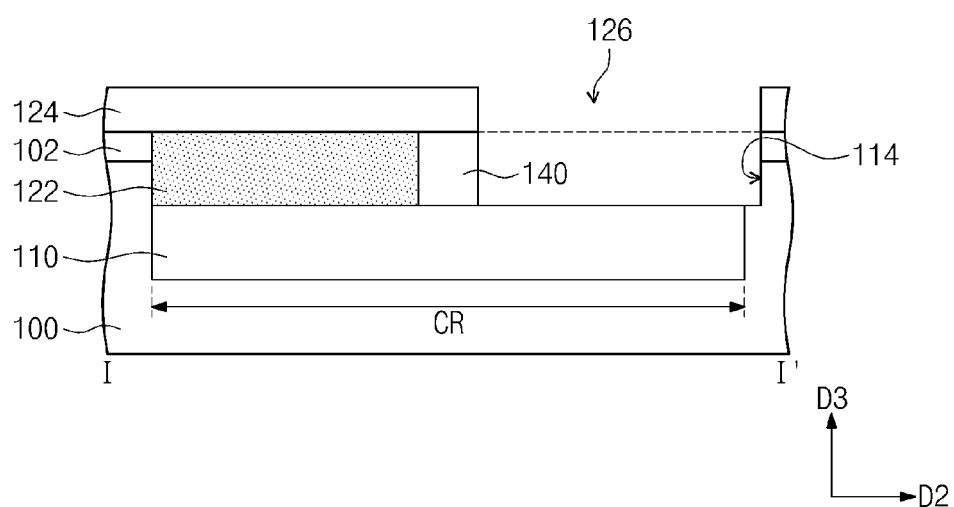

Referring to FIGS. 9A and 9B, a mold layer 124 may be formed on the semiconductor substrate 100 to cover the first semiconductor pattern 122 and the first capping pattern 118. For example, the mold layer 124 may be a silicon oxide layer and be formed using a chemical vapor deposition (CVD)

process and so forth. Thereafter, the mold layer 124 and the first capping pattern 118 may be patterned to form a second opening 126 exposing a portion of a top surface of the buried insulating pattern 110 and a portion of the semiconductor substrate 100. In certain exemplary embodiments, the second opening 126 may be formed in such a way that at least a portion thereof is overlapped with the first opening 114.

In exemplary embodiments, as the result of the formation of the second opening 126, an isolation pattern 140, which is a portion of the first capping pattern 118, is formed in the recess region 106. Due to the presence of the isolation pattern 140, the second opening 126 may be spaced apart from the first semiconductor pattern 122.

Figure 10A:
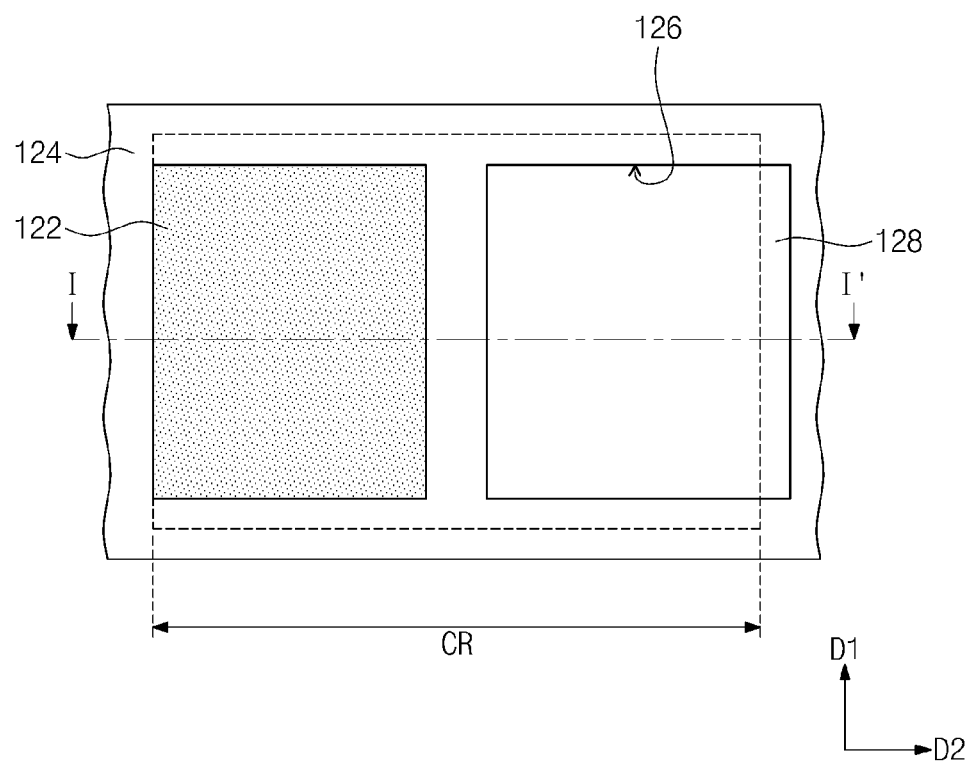
Figure 10B:
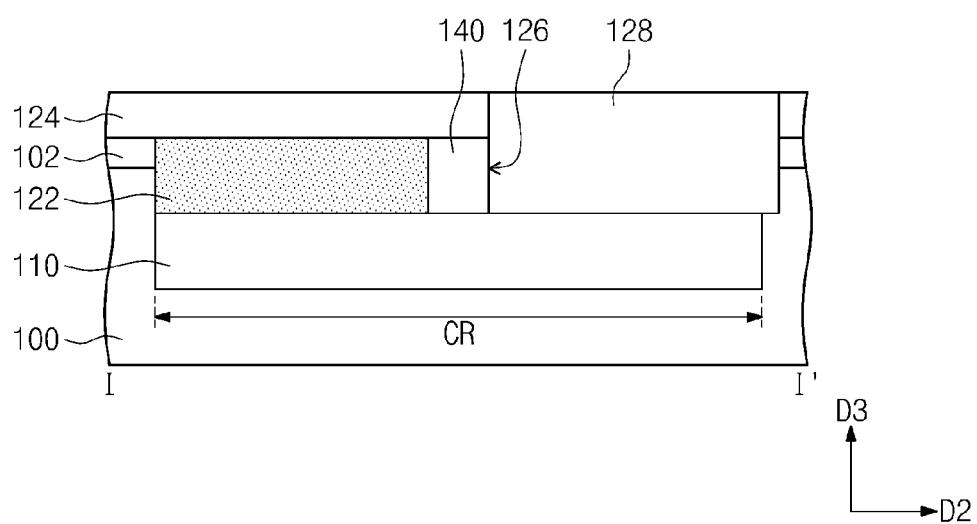

Referring to FIGS. 10A and 10B, a second semiconductor layer 128 may be formed on the semiconductor substrate 100 to cover the mold layer 124 and fill the second opening 126. In certain exemplary embodiments, at least a portion of the second semiconductor layer 128 may have an amorphous and/or polycrystalline structure and be formed of at least one of silicon (Si), germanium (Ge), silicon-germanium (SiGe), or III-V compounds. The second semiconductor layer 128 and the first semiconductor layer 112 may be formed of semiconductor materials different from each other. For example, in the case where the first semiconductor layer 112 is formed of silicon (Si), the second semiconductor layer 128 may be formed of germanium (Ge) or silicon-germanium (SiGe). The second semiconductor layer 128 may be formed using a chemical vapor deposition (CVD) process, a sputtering deposition process, and so forth. Thereafter, the second semiconductor layer 128 may be planarized to expose the mold layer 124.

Figure 11A:
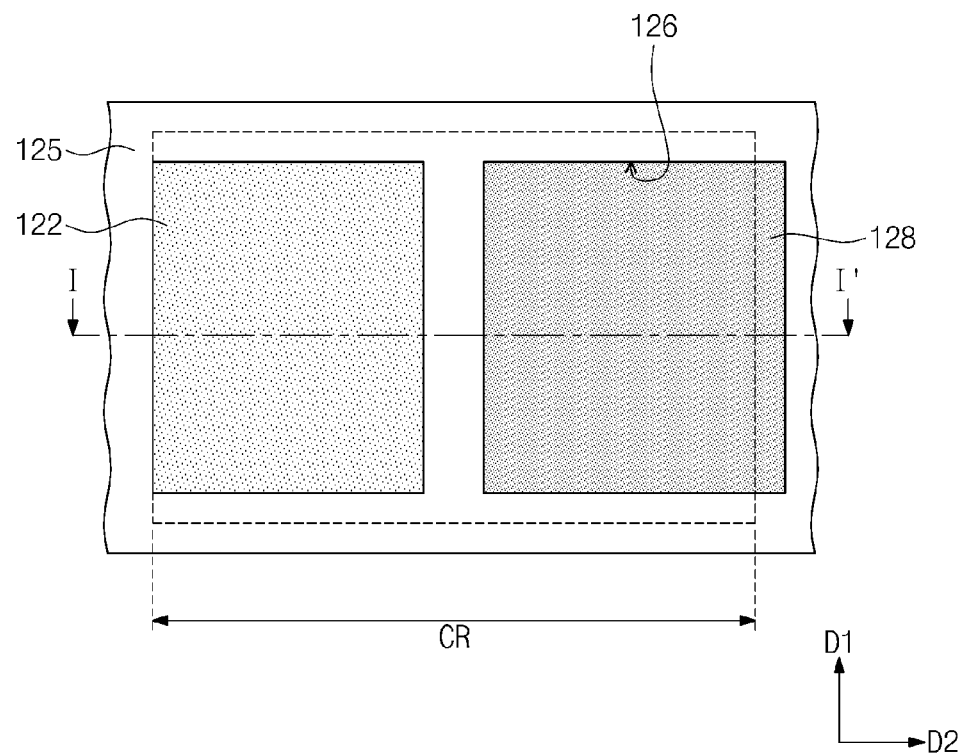
Figure 11B:
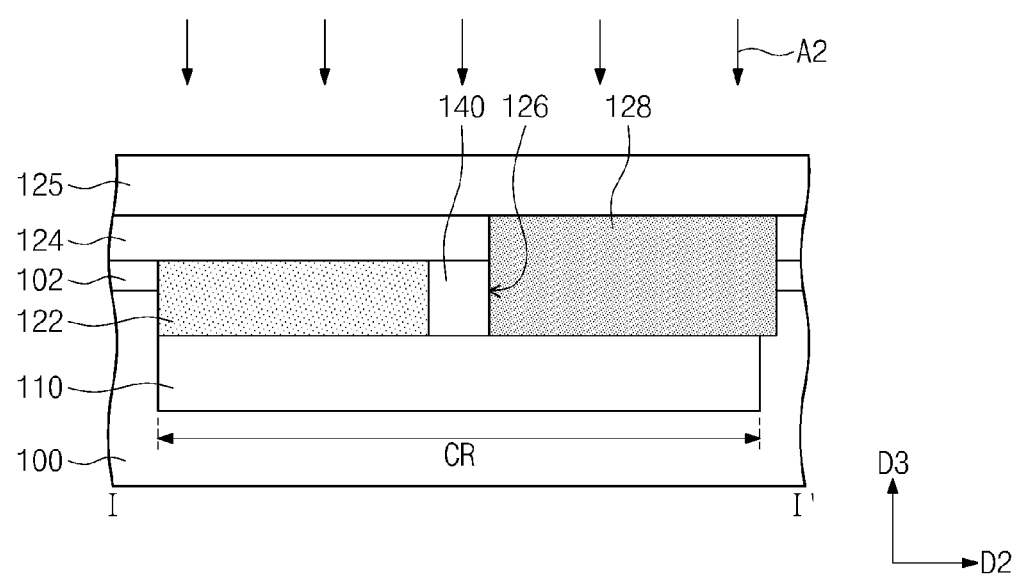

Referring to FIGS. 11A and 11B, a second capping layer 125 may be formed on the semiconductor substrate 100 to cover the mold layer 124 and the second semiconductor layer 128. As an example, the second capping layer 125 may be a silicon oxide layer, which may be formed using a chemical vapor deposition (CVD) process.

A second annealing process A2 may be performed to the semiconductor substrate 100 provided with the second capping layer 125. The second annealing process A2 may be performed at a temperature that is higher than a melting point of the second semiconductor layer 128. In exemplary embodiments, the first semiconductor layer 112 may be formed of a different material from the second semiconductor layer 128, and the melting point of the first semiconductor layer 112 may be higher than that of the second semiconductor layer 128. As an example, the first semiconductor layer 112 is formed of silicon (Si), and the second semiconductor layer 128 is formed of germanium (Ge), of which melting point is lower than that of silicon (Si). Accordingly, the second annealing process A2 may be performed at a temperature lower than that of the first annealing process A1.

For example, the second annealing process A2 may be performed using a laser annealing process or a rapid thermal treatment process. The second annealing process A2 may be performed to recrystallize the second semiconductor layer 128. For example, in the second annealing process A2, a portion of the semiconductor substrate 100 exposed by the second opening 126 may be used as a seed layer for recrystallizing the second semiconductor layer 128, and consequently, the second semiconductor layer 128 may have a single crystalline structure.

Figure 12A:
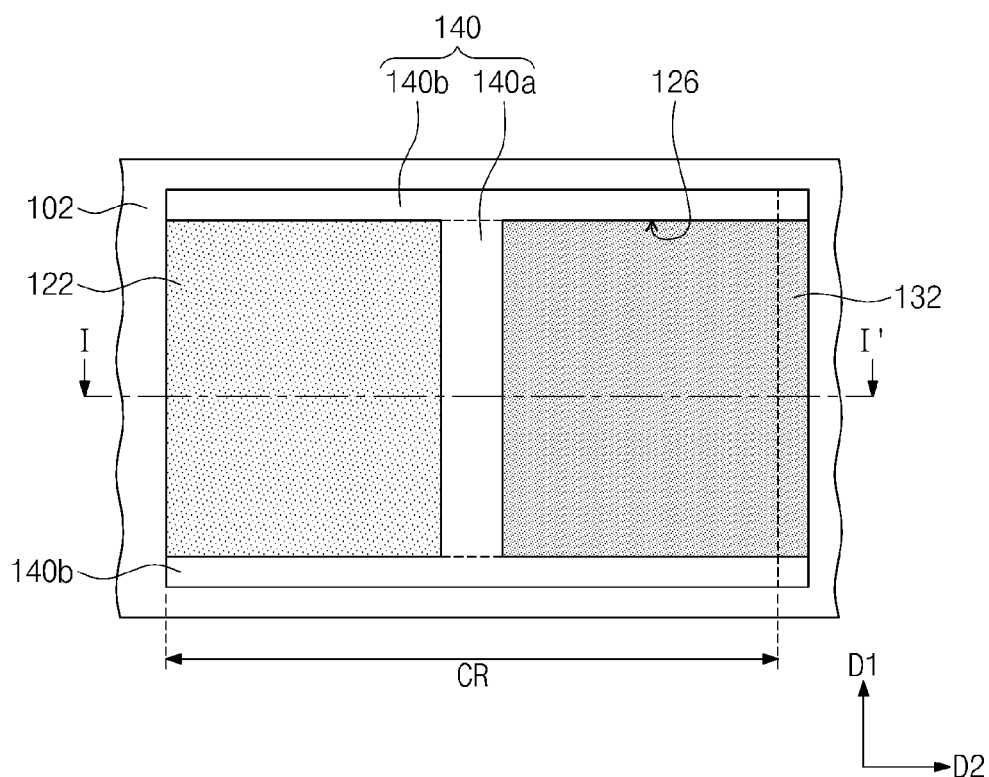
Figure 12B:
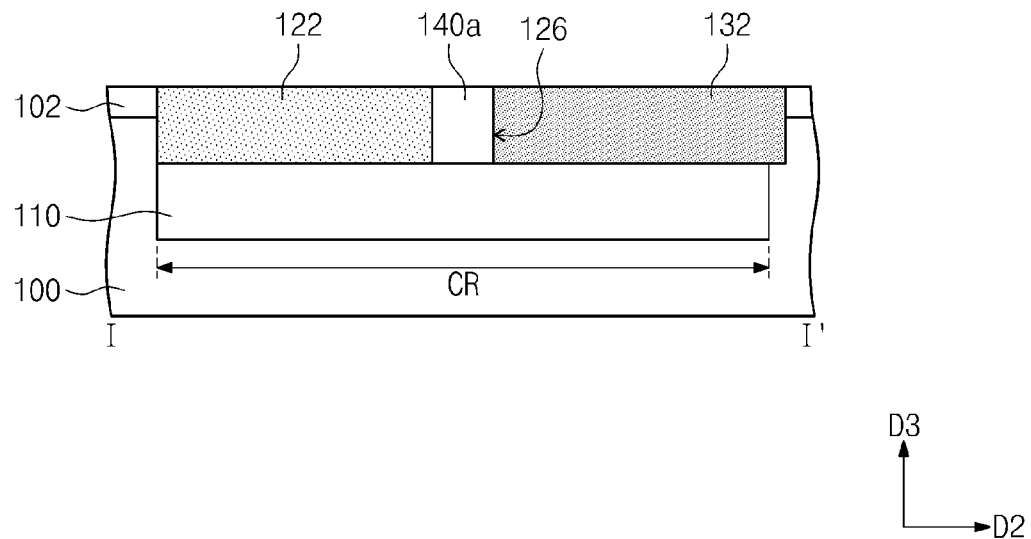

Referring to FIGS. 12A and 12B, a planarization process may be performed to the second capping layer 125, the mold layer 124, and the second semiconductor layer 128, thereby exposing the stop layer 102 and forming a second semiconductor pattern 132. The second semiconductor pattern 132 may be locally formed in the second opening 126. The planarization process may be performed to expose the top surface of the isolation pattern 140 and the top surface of the first semiconductor pattern 122.

In exemplary embodiments, the isolation pattern 140 may include a line-shaped first pattern 140a extending in the first direction D1 and line-shaped second patterns 140b extending in the second direction D2 or perpendicular to the first direction D1. The second patterns 140b may be in contact with both ends of the first pattern 140a, respectively, and the first pattern 140a and the second patterns 140b may be connected to form a single body. The first semiconductor pattern 122 and the second semiconductor pattern 132 may be formed spaced apart from each other by the first pattern 140a and be in contact with both sidewalls of the first pattern 140a, respectively. In addition, the first semiconductor pattern 122 and the second semiconductor pattern 132 may be in contact with sidewalls of the second patterns 140b.

As the result of the planarization process, the isolation pattern 140, the first semiconductor pattern 122, and the second semiconductor pattern 132 may have top surfaces that are substantially coplanar with each other.

Figure 13A:
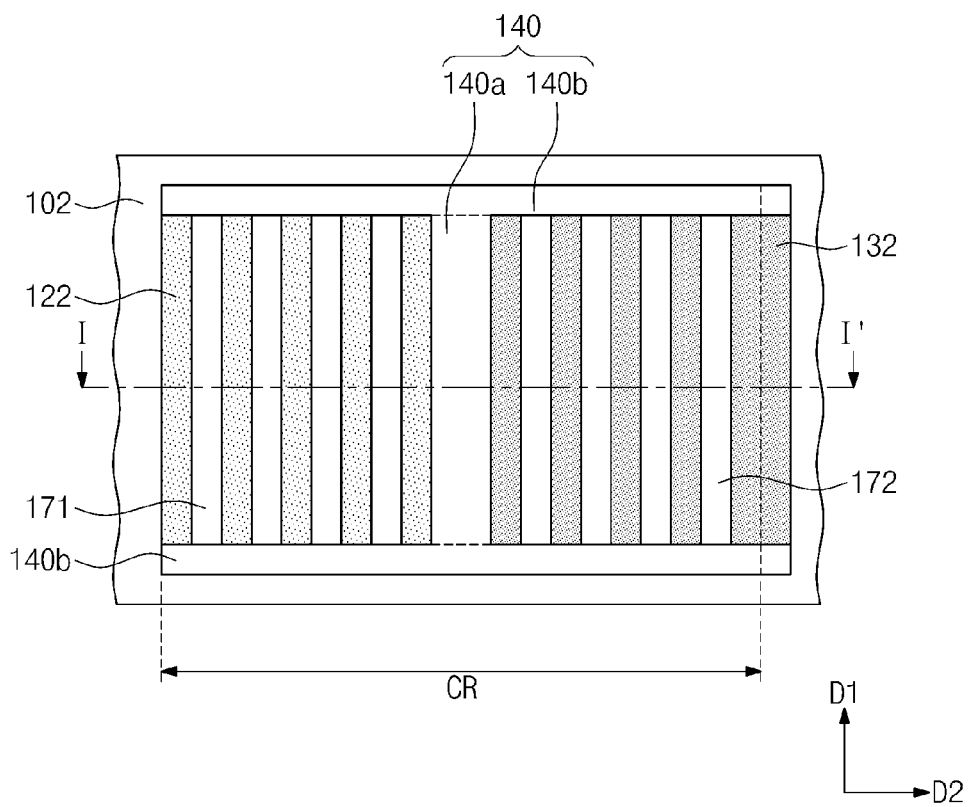
Figure 13B:
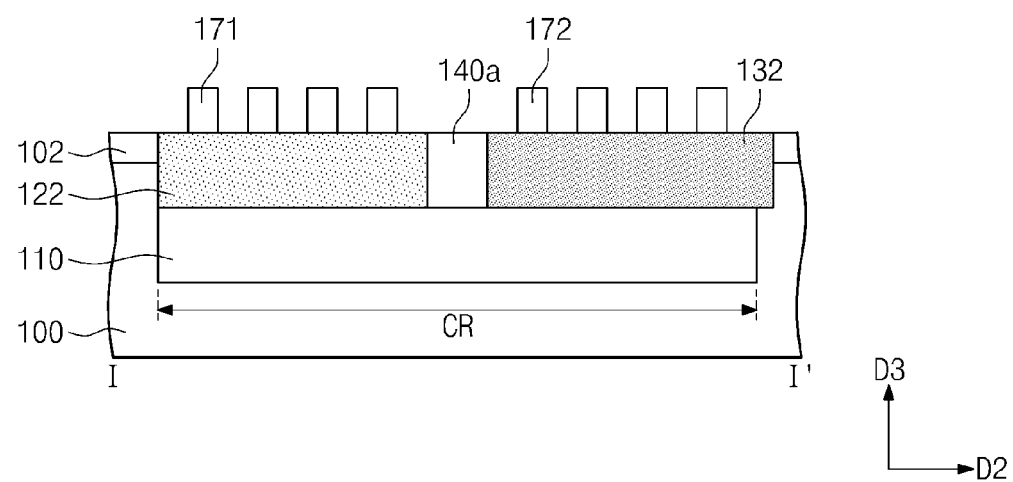

Referring to FIGS. 13A and 13B, first mask patterns 171 and second mask patterns 172 may be formed on the first semiconductor pattern 122 and the second semiconductor pattern 132, respectively, to have openings for defining active patterns. The first and second mask patterns 171 and 172 may be hard mask patterns or photoresist patterns.

In exemplary embodiments, the first mask patterns 171 may be spaced apart from each other in the second direction D2 and each of them may be formed to have a line shape extending in the first direction D1. Similarly, the second mask patterns 172 may be spaced apart from each other in the second direction D2 and each of them may be formed to have a line shape extending in the first direction D1.

Referring back to FIGS. 3A and 3B, the first semiconductor pattern 122 may be etched using the first mask patterns 171 as an etch mask to form first active patterns 120 on the buried insulating pattern 110. Further, the second semiconductor pattern 132 may be etched using the second mask patterns 172 as an etch mask to form second active patterns 130 on the buried insulating pattern 110. In exemplary embodiments, a plurality of the first active patterns 120 and a plurality of the second active patterns 130 may be formed in the buried insulating pattern 110. The etching of the first and second semiconductor patterns 122 and 132 may be simultaneously performed using the same process, and thus, the first and second active patterns 120 and 130 may be formed at substantially the same time. The first active pattern 120 and the second active pattern 130 may be separated from each other by the first pattern 140a interposed therebetween, and the first pattern 140a may be spaced apart from the first and second active patterns 120 and 130, respectively.

The buried insulating pattern 110 may include a first region R1 on which the first active pattern 120 is provided, and a second region R2 on which the second active pattern 130 is provided. One of the first and second regions R1 and R2 may be an NMOS region, and the other may be a PMOS region.

Thereafter, a first gate electrode 150 may be formed to cross the first active pattern 120 and a second gate electrode 160 may be formed to cross the second active pattern 130. In certain exemplary embodiments, the first and second gate electrodes 150 and 160 may be formed, at substantially the same time, for example, using the same process. Alternatively, the first and second gate electrodes 150 and 160 may be separately formed by different processes.

As the result of the formation of the first gate electrode 150, the first active pattern 120 may include a first channel region CHR1 positioned below the first gate electrode 150 and first source/drain regions SD1 positioned at both sides of the first gate electrode 150. As the result of the formation of the second gate electrode 160, the second active pattern 130 may include a second channel region CHR2 positioned below the second gate electrode 160 and second source/drain regions SD2 positioned at both sides of the second gate electrode 160. A first transistor TR1 may include the first channel region CHR1, the first source/drain regions SD1, and the first gate electrode 150, and a second transistor TR2 may include the second channel region CHR2, the second source/drain regions SD2, and the second gate electrode 160. Since the first and second active patterns 120 and 130 are formed of different materials from each other, the first and second transistors TR1 and TR2 may have different electric characteristics from each other.

Thereafter, although not shown, an interlayered insulating layer may be formed on the structure with the first and second gate electrodes 150 and 160. The interlayered insulating layer may be formed of oxide, nitride, and/or oxynitride. Through holes may be formed to expose the source/drain regions SD1 and SD2 through the interlayered insulating layer, and then, contact plugs may be formed in the through holes, respectively. Interconnection lines may be formed on the interlayered insulating layer to be in contact with the contact plugs. The contact plugs and the interconnection lines may include a conductive material.

According to exemplary embodiments, the buried insulating pattern 110 may be formed on or in the semiconductor substrate 100 (e.g., a bulk silicon wafer) to define the unit cell region CR, and then, the transistors TR1 and TR2 may be formed on the buried insulating pattern 110 to have different electric characteristics from each other. This makes it possible to reduce fabrication cost of the semiconductor device, when compared with the use of expensive silicon-on-insulator (SOI) wafer.

In addition, since the first and second active patterns 120 and 130 for channel regions of the transistors TR1 and TR2 are formed using the first and second semiconductor patterns 122 and 132 that are recrystallized by the annealing process, each of them may include a defect-free or defect-less portion (e.g., a single crystalline structure). Further, the first and second active patterns 120 and 130 may be formed at substantially the same time, and thus, the transistors TR1 and TR2 may be easily formed to have different electric characteristics from each other. Accordingly, it is possible to form easily a semiconductor device having improved electric characteristics.

Figure 14A:
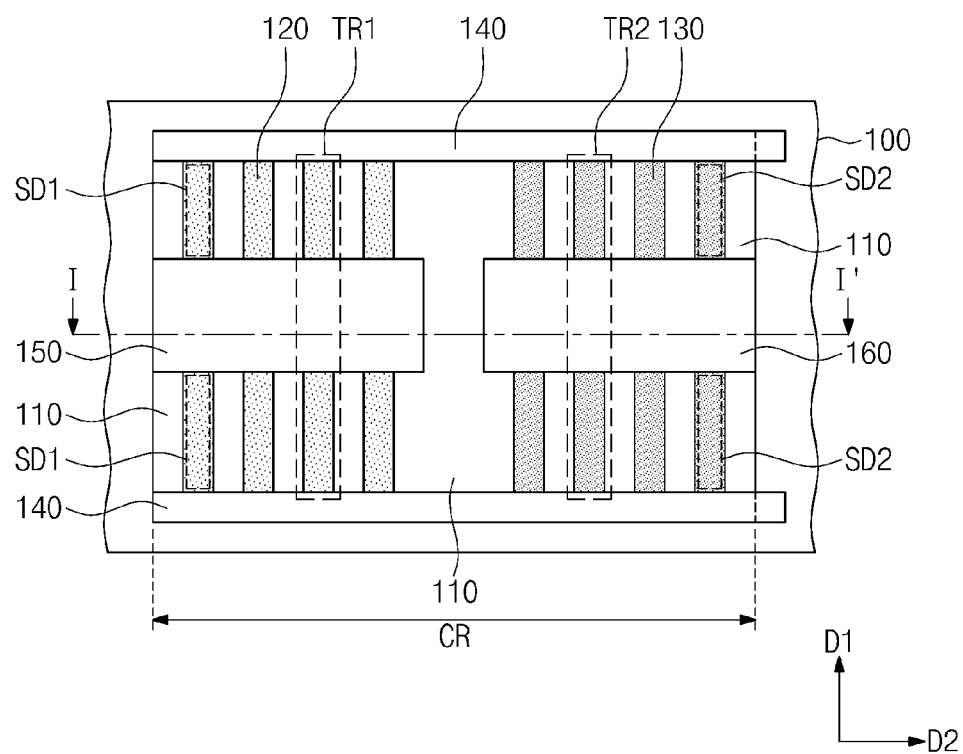
FIG. 14A is a plan view of a semiconductor device according to another exemplary embodiment.
Figure 14B:
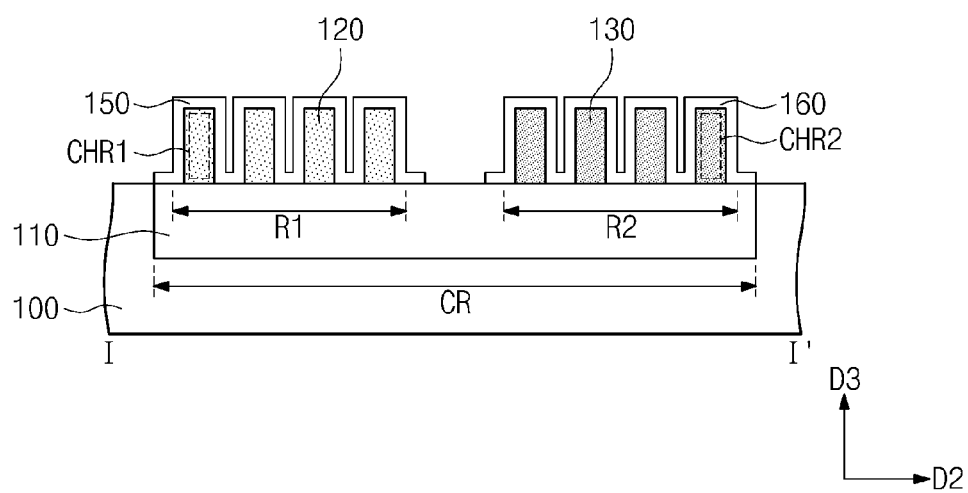
FIG. 14B is a sectional view taken along line I-I' of FIG. 14A.

FIG. 14A is a plan view of a semiconductor device according to another exemplary embodiment, and FIG. 14B is a sectional view taken along line I-I' of FIG. 14A. In the following description of FIGS. 14A and 14B, an element previously described with reference to FIGS. 1, 2, 3A, and 3B may be identified by a similar or identical reference number without repeating an overlapping description thereof, for the sake of brevity.

Referring to FIGS. 1, 14A, and 14B, a semiconductor substrate 100 may include a cell array CA, on which a plurality of unit cells CU are provided. The plurality of unit cells CU may be provided on a plurality of unit cell regions CR, respectively.

Each of the unit cells CU may include a buried insulating pattern 110 buried in the semiconductor substrate 100, a first active pattern 120 provided on the buried insulating pattern 110, a second active pattern 130 provided on the buried insulating pattern 110 and spaced apart from the first active pattern 120, a first gate electrode 150 crossing the first active pattern 120, and a second gate electrode 160 crossing the second active pattern 130. In another exemplary embodiment, each of the unit cells CU may further include isolation patterns 140 on the buried insulating pattern 110, and the isolation patterns 140 may not be provided between the first and second active patterns 120 and 130.

For example, each of the first and second active patterns 120 and 130 may have a line-shaped structure extending parallel to the first direction D1, and the first and second active patterns 120 and 130 may be spaced apart from each other in the second direction D2 or perpendicular to the first direction D1. The isolation patterns 140 may be spaced apart from each other in the first direction D1, and each of them may have a line-shaped structure extending parallel to the second direction D2. The isolation patterns 140 may be in contact with ends of the first and second active patterns 120 and 130.

FIGS. 15A through 18A are plan views illustrating a method of fabricating a semiconductor device, according to another exemplary embodiment, and FIGS. 15B through 18B are sectional views taken along lines I-I' of FIGS. 15A through 18A, respectively. In the following description of FIGS. 15A through 18A and 15B through 18B, an element or fabrication step previously described with reference to FIGS. 4A through 13A and 4B through 13B may be identified by a similar or identical reference number without repeating an overlapping description thereof, for the sake of brevity.

As described with reference to FIGS. 4A through 5B, a buried insulating pattern 110 may be formed on or in a semiconductor substrate 100, and an upper portion of the buried insulating pattern 110 may be etched to form a recess region 106 exposing inner sidewalls of the semiconductor substrate 100. A first semiconductor pattern 122 and a first capping pattern 118 may be formed in the recess region 106. The first semiconductor pattern 122 and the first capping pattern 118 may be formed by substantially the same fabrication method as that described with reference to FIGS. 6A through 8B.

Figure 15A:
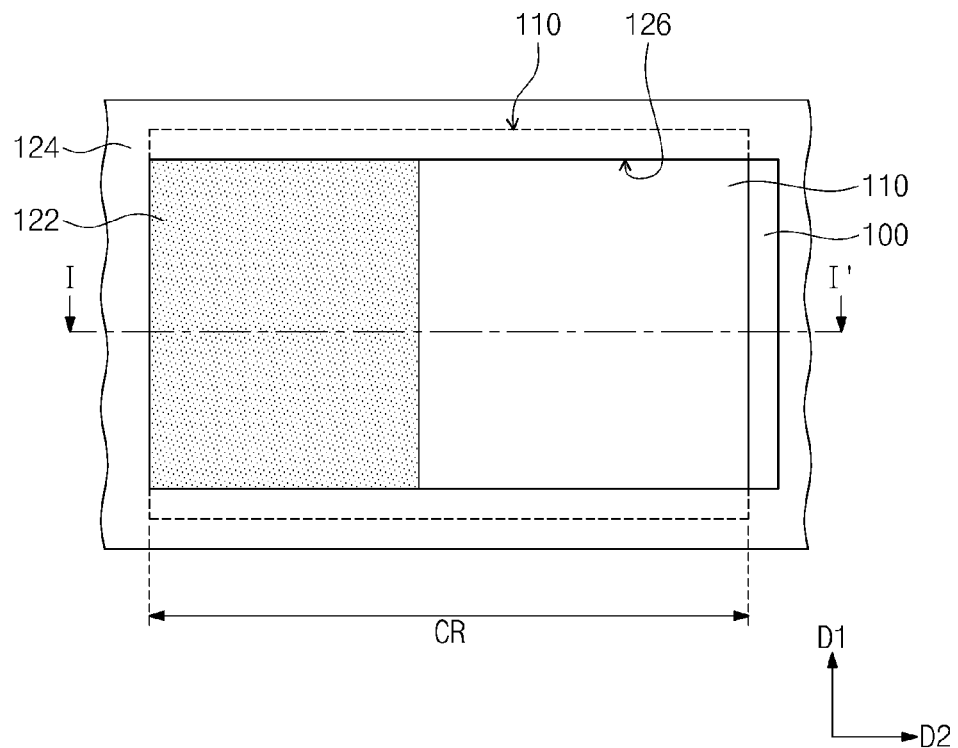
Figure 15B:
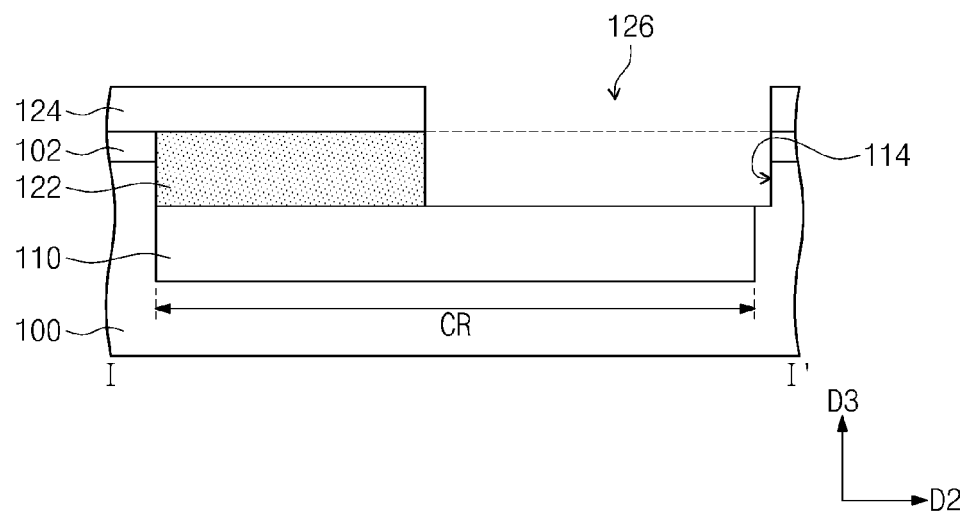

Referring to FIGS. 15A and 15B, a mold layer 124 may be formed on the semiconductor substrate 100 to cover the first semiconductor pattern 122 and the first capping pattern 118. The mold layer 124 and the first capping pattern 118 may be patterned to form a second opening 126. The second opening 126 may be formed to expose a top surface of the buried insulating pattern 110, a portion of the semiconductor substrate 100, and a portion of a sidewall of the first semiconductor pattern 122 and be overlapped with a portion of the first opening 114 described with reference to FIG. 6A.

Figure 16A:
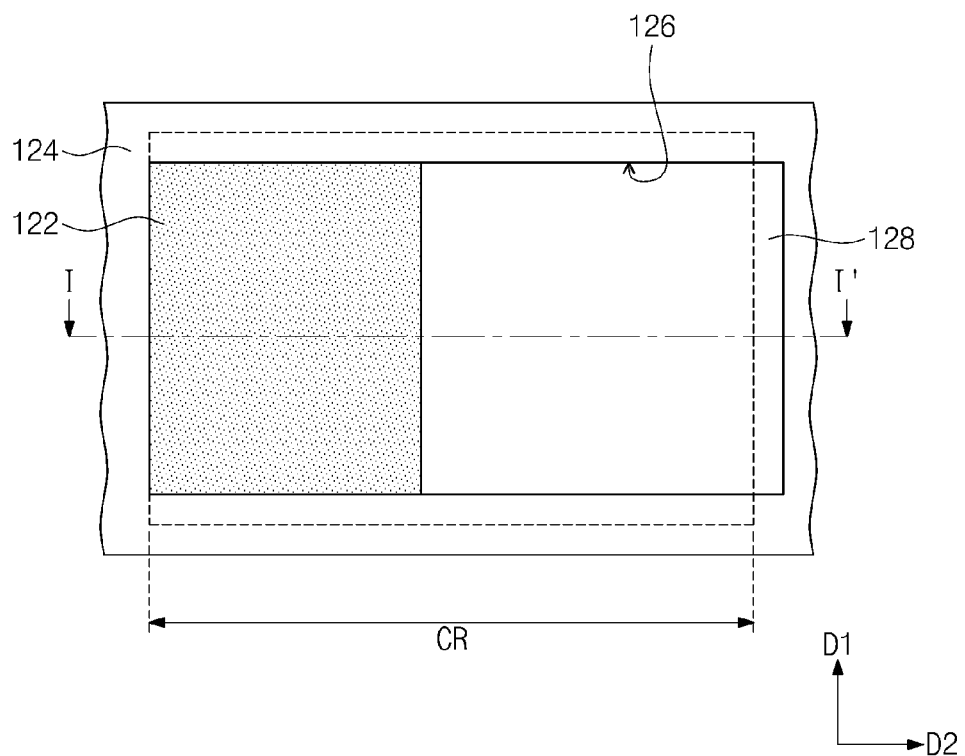
Figure 16B:
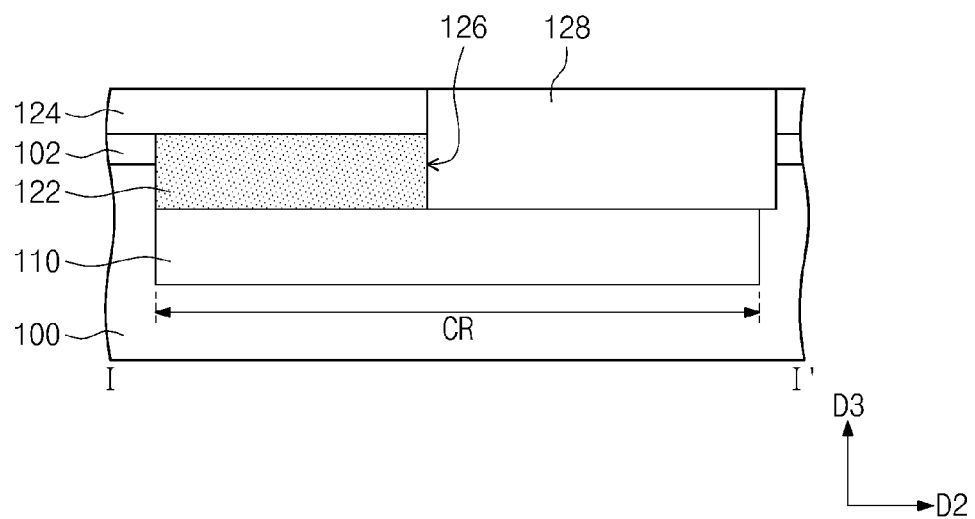

Referring to FIGS. 16A and 16B, a second semiconductor layer 128 may be formed on the semiconductor substrate 100 to cover the mold layer 124 and fill the second opening 126. Thereafter, the second semiconductor layer 128 may be planarized to expose the mold layer 124.

Figure 17A:
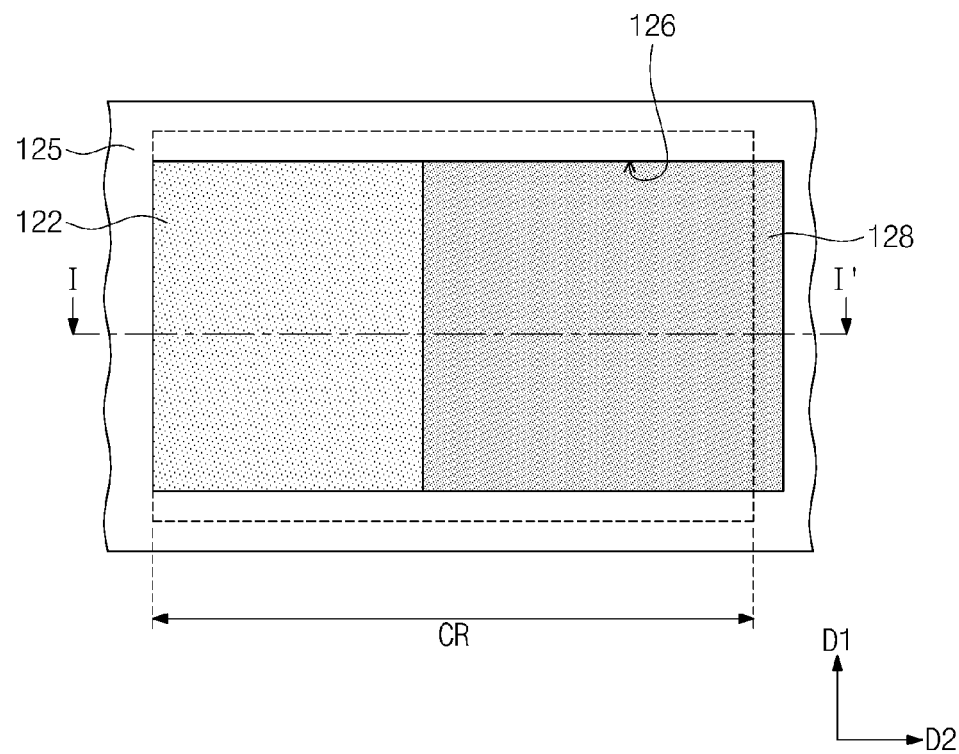
Figure 17B:
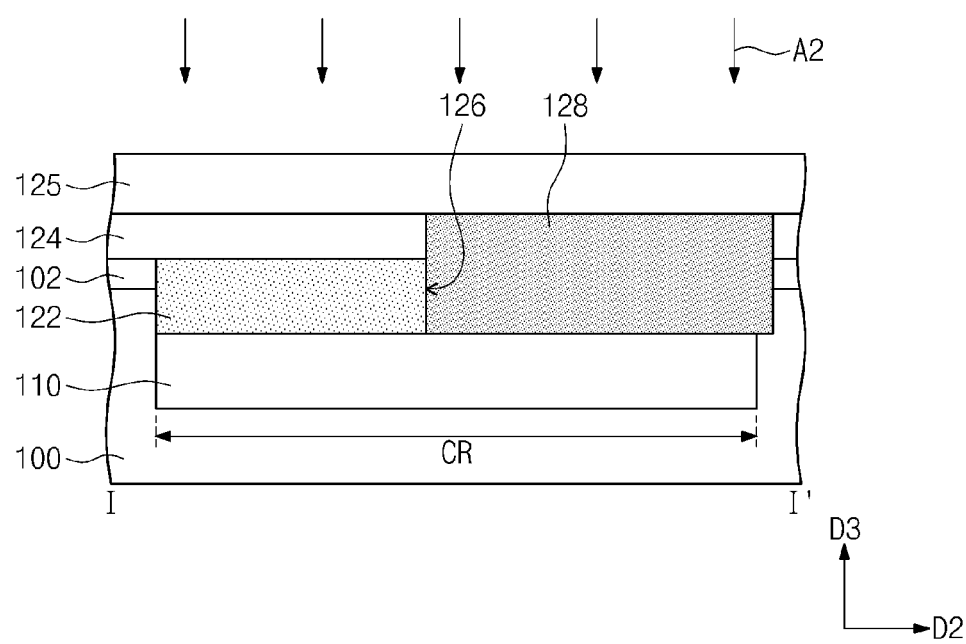

Referring to FIGS. 17A and 17B, a second capping layer 125 may be formed on the semiconductor substrate 100 to cover the mold layer 124 and the second semiconductor layer 128. A second annealing process A2 may be performed to the semiconductor substrate 100 provided with the second capping layer 125. The second annealing process A2 may be performed at a temperature that is higher than a melting point of the second semiconductor layer 128. Similar to the fabrication method described with reference to FIGS. 11A and 11B, the second annealing process A2 may be performed at a temperature lower than that of the first annealing process A1 described with reference to FIG. 7A.

Figure 18A:
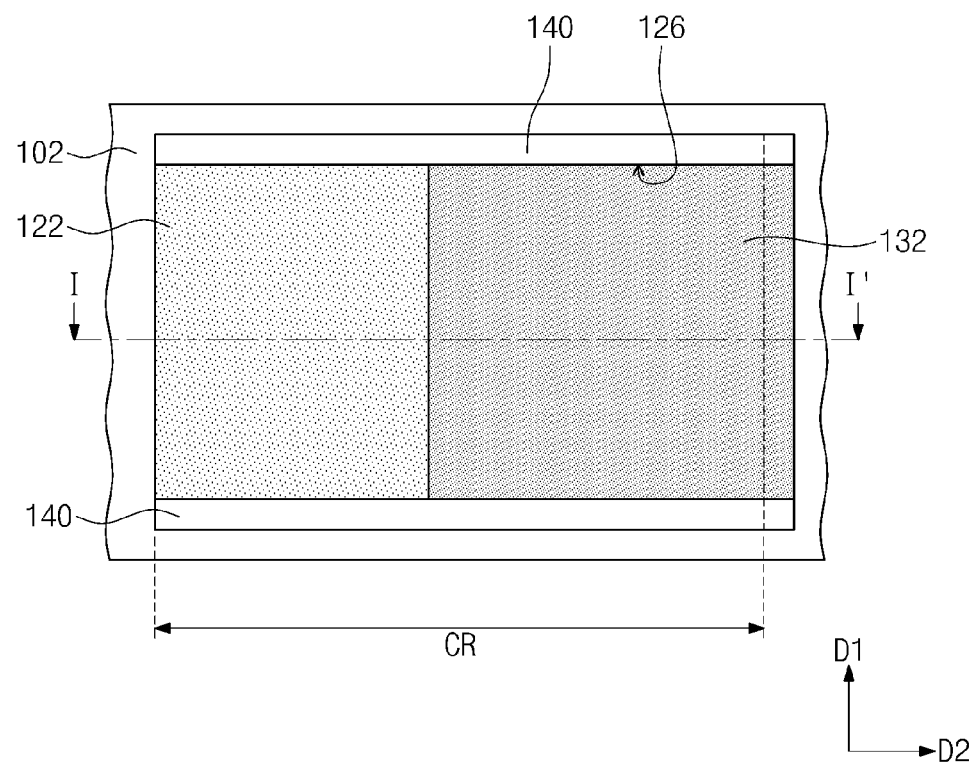
Figure 18B:
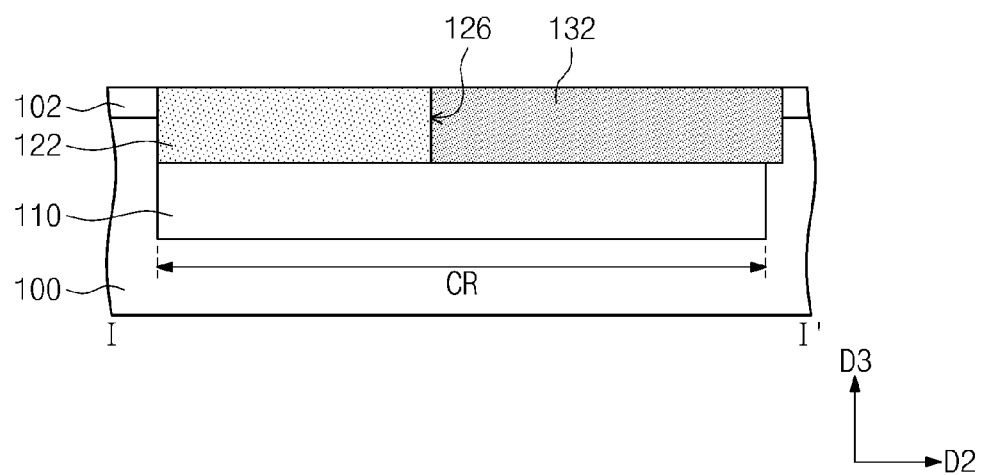

Referring to FIGS. 18A and 18B, a planarization process may be performed to the second capping layer 125, the mold layer 124, and the second semiconductor layer 128, thereby exposing the stop layer 102 and forming a second semiconductor pattern 132. The second semiconductor pattern 132 may be locally formed in the second opening 126. According to the exemplary embodiments, as the result of the formation of the second opening 126, the first capping pattern 118 may be divided into a plurality of isolation patterns 140, and as the result of the planarization process, top surfaces of the isolation patterns 140 and the first semiconductor pattern 122 may be exposed.

In another exemplary embodiment, the isolation patterns 140 may be spaced apart from each other in the first direction D1, and each of them may have a line-shaped structure extending parallel to the second direction D2. The isolation patterns 140 may be separated from each other with the first semiconductor pattern 122 and the second semiconductor pattern 132 interposed therebetween. In addition, the first semiconductor pattern 122 and the second semiconductor pattern 132 may be in contact with sidewalls of the isolation patterns 140, respectively, and the first and second semiconductor patterns 122 and 132 may have sidewalls that are in contact with each other.

As the result of the planarization process, the isolation patterns 140, the first semiconductor pattern 122, and the second semiconductor pattern 132 may have top surfaces that are substantially coplanar with each other. Thereafter, as described with reference to FIGS. 13A and 13B, mask patterns may be formed on the first and second semiconductor patterns 122 and 132 to have openings for defining active patterns.

Referring back to FIGS. 14A and 14B, the first and second semiconductor patterns 122 and 132 may be etched using the mask patterns as an etch mask to form a first active pattern 120 and a second active pattern 130 on the buried insulating pattern 110. The first and second active patterns 120 and 130 may be formed at substantially the same time. In this case, the isolation patterns 140 may not be provided between the first and second active patterns 120 and 130. The subsequent process may be performed by substantially the same method as that described with reference to FIGS. 3A and 3B.

Figure 19:
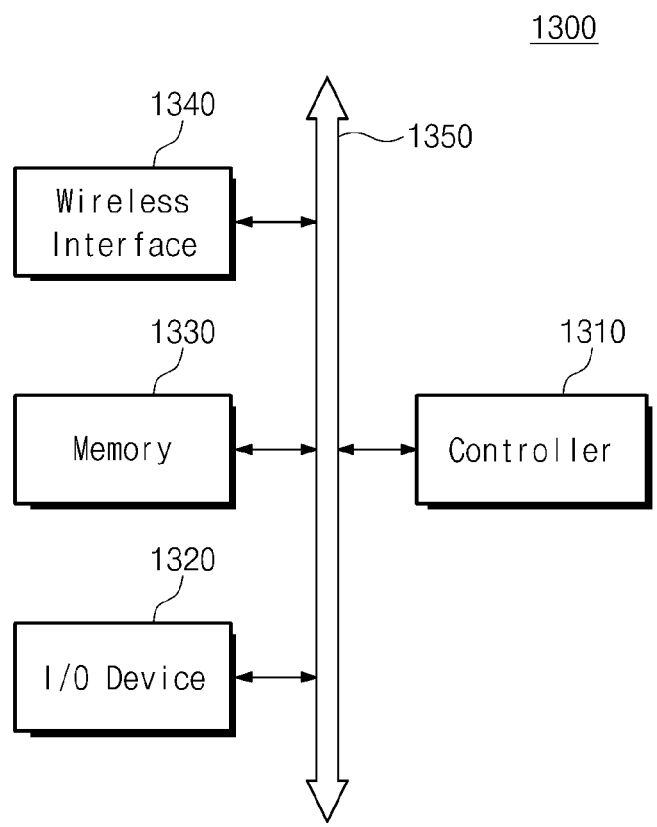
FIGS. 19 and 20 are schematic block diagrams illustrating an example of an electronic device including a semiconductor device according to an exemplary embodiment.
Figure 20:
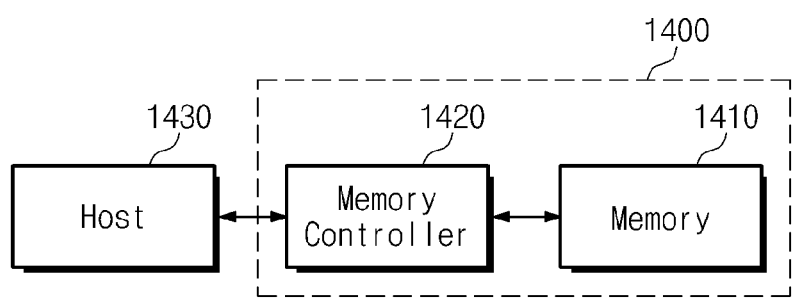

FIGS. 19 and 20 are block diagrams schematically illustrating an electronic device including a semiconductor device according to exemplary embodiments.

Referring to FIG. 19, an electronic device 1300 including a semiconductor device according to exemplary embodiments may be used in a personal digital assistant (PDA), a laptop computer, a mobile computer, a web tablet, a wireless phone, a cell phone, a digital music player, a wire or wireless electronic device, or a complex electronic device including at least two ones thereof, or the like. The electronic device 1300 may include a controller 1310, an input/output (I/O) device 1320 such as a keypad, a keyboard, and/or a display, a memory 1330, and a wireless interface 1340 that may communicate with each other through a data bus 1350. The controller 1310 may include, for example, at least one of a microprocessor, a digital signal process, a microcontroller or the like. The memory 1330 may be configured to store commands and/or data. The memory 1330 may include a semiconductor device according to exemplary embodiments. The electronic device 1300 may use a wireless interface 1340 configured to transmit data to a wireless communication network or receive data from a wireless communication network. The wireless interface 1340 may include, for example, an antenna, a wireless transceiver and so on. The electronic device 1300 may be used in a communication interface protocol of a communication system such as CDMA (Code Division Multiple Access), GSM (Global System for Mobiles), NADC (North American Digital Communications), E-TDMA (Extended-Time Division Multiple Access), WCDMA (Wideband Code-Division Multiple Access), CDMA2000, Wi-Fi, Muni Wi-Fi (Municipal Wi-Fi), Bluetooth, DECT (Digital Enhanced Cordless Telecommunications), Wireless USB, Flash-OFDM (Orthogonal Frequency Division Multiplexing), IEEE 802.20, GPRS (General Packet Radio Service), iBurst (or HC-SDMA, High Capacity Spatial Division Multiple Access), WiBro (Wireless Broadband), WiMAX (Worldwide Interoperability for Microwave Access), WiMAX-Advanced, UMTS-TDD (Universal Mobile Telecommunications System-Frequency Division Duplex), HSPA (High Speed Packet Access), EVDO (Enhanced Voice-Data Optimized), LTE-Advanced (Long-Term Evolution-Advanced), MMDS (Multichannel Multipoint Distribution Service), and so forth.

Referring to FIG. 20, a memory system including a semiconductor device according to exemplary embodiments will be described. The memory system 1400 may include a memory 1410 for storing data and a memory controller 1420. The memory controller 1420 may control the memory 1410 so as to read data stored in the memory device 1410 or to write data into the memory 1410 in response to a read/write request of a host 1430. The memory controller 1420 may include an address mapping table for mapping an address provided from the host 1430 (e.g., a mobile device or a computer system) into a physical address of the memory 1410. The memory 1410 may be a semiconductor device according to exemplary embodiments.

The package in which the semiconductor memory device according to one of the above exemplary embodiments is mounted may further include at least one semiconductor device (e.g., a controller and/or a logic device) that controls the semiconductor memory device.

According to exemplary embodiments, the buried insulating pattern may be provided on a bulk silicon wafer to define the unit cell region, and the first and second active patterns including semiconductor materials different from each other may be provided on the buried insulating pattern. This makes it possible to improve cost-effectively electric characteristics of the semiconductor device.

While exemplary embodiments have been particularly shown and described, it will be understood by one of ordinary skill in the art that variations in form and detail may be made therein without departing from the spirit and scope of the attached claims.

What is claimed is:
1. A semiconductor device comprising:
a plurality of unit cells provided on a semiconductor substrate, each of the unit cells comprising:
a buried insulating pattern on the semiconductor substrate;
a first active pattern provided on the buried insulating pattern; and
a second active pattern provided on the buried insulating pattern and spaced apart from the first active pattern,
wherein the buried insulating pattern defines a unit cell region, in which each of the unit cells is disposed, and wherein a portion of the semiconductor substrate extends along a direction perpendicular to an upper surface of the semiconductor substrate to cover a sidewall of the buried insulating pattern.

2. The device of claim 1, wherein the buried insulating pattern is provided in plural, the plurality of the unit cells comprise a plurality of buried insulating patterns, respectively, and the plurality of buried insulating patterns are spaced apart from each other with the portion of the semiconductor substrate interposed therebetween.

3. The device of claim 1, wherein the semiconductor substrate is a bulk silicon wafer.

4. The device of claim 1, wherein the first active pattern comprises a semiconductor material that is different from that of the second active pattern.

5. The device of claim 1, wherein the buried insulating pattern comprises a first region on which the first active pattern is disposed and a second region on which the second active pattern is disposed, and
wherein one of the first and second regions is an N-type metal-oxide-semiconductor (NMOS) region and the other is a P-type metal-oxide-semiconductor (PMOS) region.

6. The device of claim 1, further comprising an isolation pattern disposed on the buried insulating pattern and between the first active pattern and the second active pattern.

7. The device of claim 1, further comprising:
a first gate electrode disposed on the buried insulating pattern to cross the first active pattern; and
a second gate electrode disposed on the buried insulating pattern to cross the second active pattern.

8. A semiconductor device comprising:
a semiconductor substrate which comprises a plurality of unit cells, each of the unit cells comprising:
a buried insulating pattern on the semiconductor substrate, which comprises a first region on which a first active pattern is provided and a second region on which a second active pattern is provided;
a first transistor formed on the buried insulating pattern, which comprises a first gate electrode crossing the first active pattern, a first channel region positioned below the first gate electrode, and first source/drain regions positioned at both sides of the first gate electrode; and
a second transistor formed on the buried insulating pattern, which comprises a second gate electrode crossing the second active pattern, a second channel region positioned below the second gate electrode, and second source/drain regions positioned at both sides of the second gate electrode,
wherein the buried insulating pattern is provided in plural, the plurality of the unit cells comprise a plurality of buried insulating patterns, respectively, and the plurality of buried insulating patterns are spaced apart from each other with the semiconductor substrate interposed therebetween.

9. The device of claim 8, wherein the semiconductor substrate is a bulk silicon wafer.

10. The device of claim 8, wherein the first transistor and the second transistor are configured to have different electric characteristics from each other.

11. The device of claim 8, wherein one of the first and second regions is an N-type metal-oxide-semiconductor (NMOS) region and the other is a P-type metal-oxide-semiconductor (PMOS) region.

12. The device of claim 8, wherein the buried insulating pattern further comprises an isolation pattern disposed between the first active pattern and the second active pattern.

* * * * *